United States Patent [19]

Nalbanti

[11] Patent Number: 4,633,239
[45] Date of Patent: Dec. 30, 1986

[54] INTEGRATED CIRCUIT PACKAGE HOLDER

[76] Inventor: Georges Nalbanti, 68, rue de Tournaisis, Elancourt 78310 Maurepas, France

[21] Appl. No.: 652,977

[22] Filed: Sep. 21, 1984

[30] Foreign Application Priority Data

Sep. 23, 1983 [FR] France ................. 83 15150

[51] Int. Cl.$^4$ ............................................. G08B 21/00
[52] U.S. Cl. ..................... 340/636; 340/693;
     339/17 CF; 307/66; 307/64
[58] Field of Search .......... 339/17 C, 17 CF;
     340/636, 693; 307/64, 66

[56] References Cited

U.S. PATENT DOCUMENTS

| | | | |
|---|---|---|---|
| 2,782,389 | 2/1957 | Sunko et al. | 339/192 |
| 3,289,045 | 11/1966 | Pritikin et al. | 317/101 |
| 3,575,678 | 4/1971 | Barton | 335/151 |
| 3,634,600 | 1/1972 | Griffin | 174/52 S |
| 4,245,877 | 1/1981 | Auriana | 339/74 R |
| 4,381,458 | 4/1983 | Anstey et al. | 307/64 X |

FOREIGN PATENT DOCUMENTS 2752385 1/1979 Fed. Rep. of Germany .
8204359 12/1982 PCT Int'l Appl. .

Primary Examiner—James L. Rowland
Assistant Examiner—Jeffery A. Hofsass
Attorney, Agent, or Firm—Laubscher & Laubscher

[57] ABSTRACT

An integrated circuit package holder comprises a recess for a receipt of a removable spare power source such as two miniature cells to be interconnected between two pins of the holder into which two package supply pins are plugged. The holder can further contain, in a hybrid or integrated form, a circuit for detecting a voltage across spare source terminals that is lower than a predetermined discharge threshold, and a circuit for inhibiting a predetermined function in the integrated circuit when a main power source voltage between the supply pins disappears. A cover inserted between the holder and the package can be provided to connect the package pins to the holder pins without soldering, the cover and the package being locked to the holder by means of single pressures.

41 Claims, 36 Drawing Figures

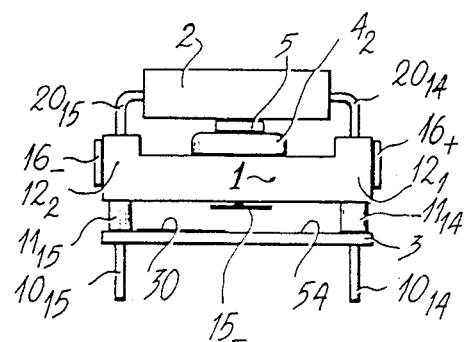
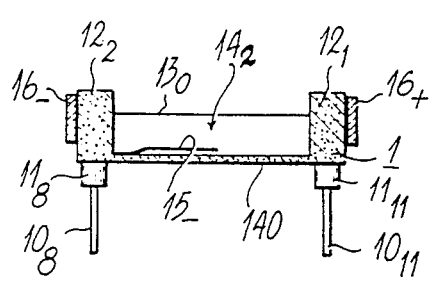
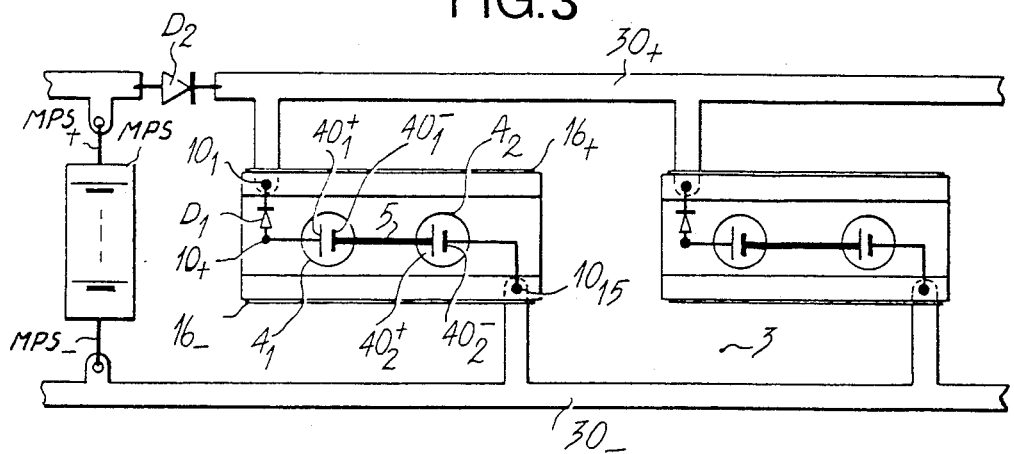
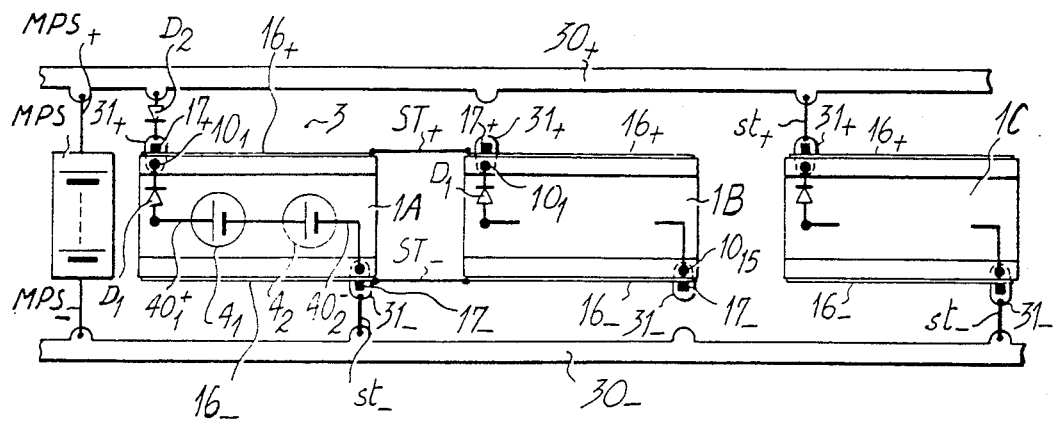

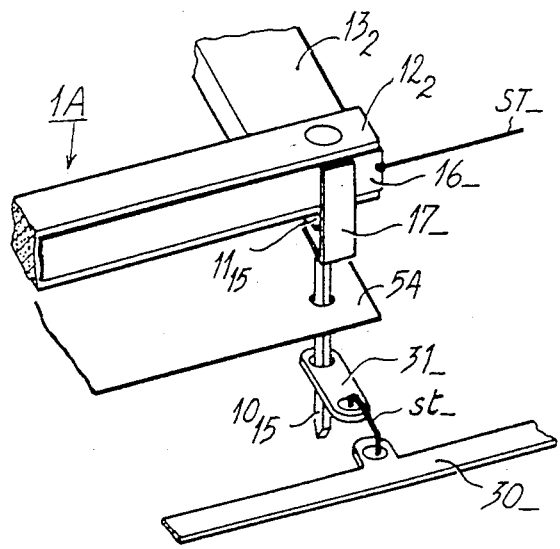
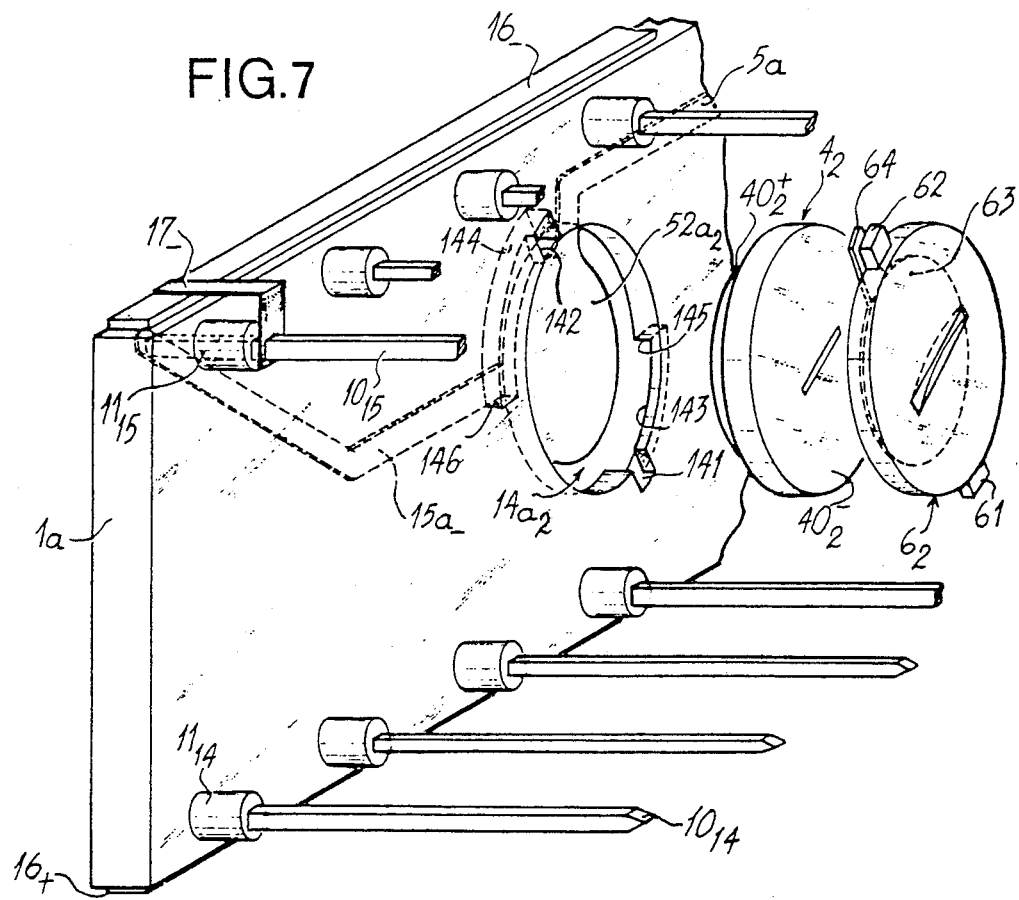

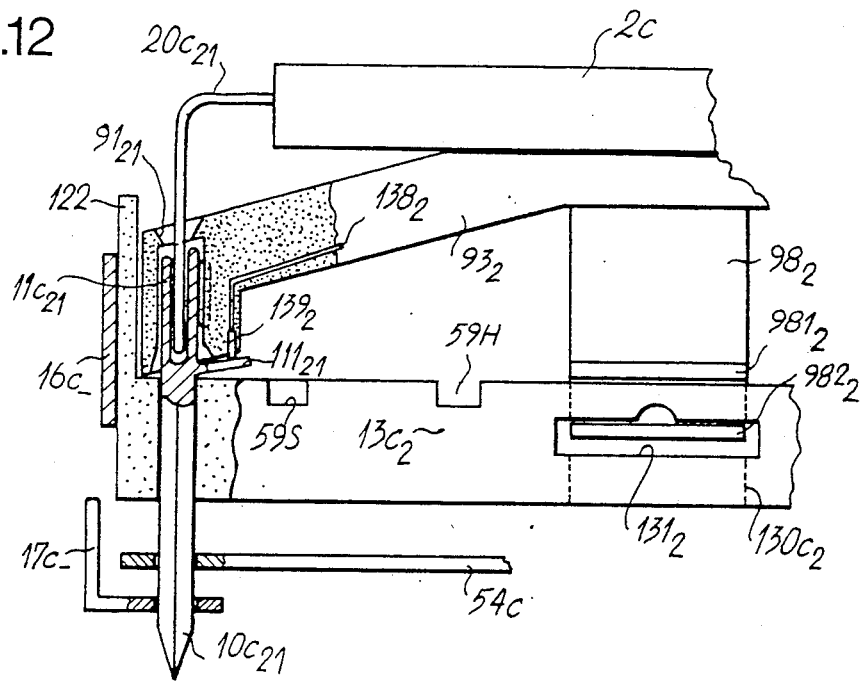
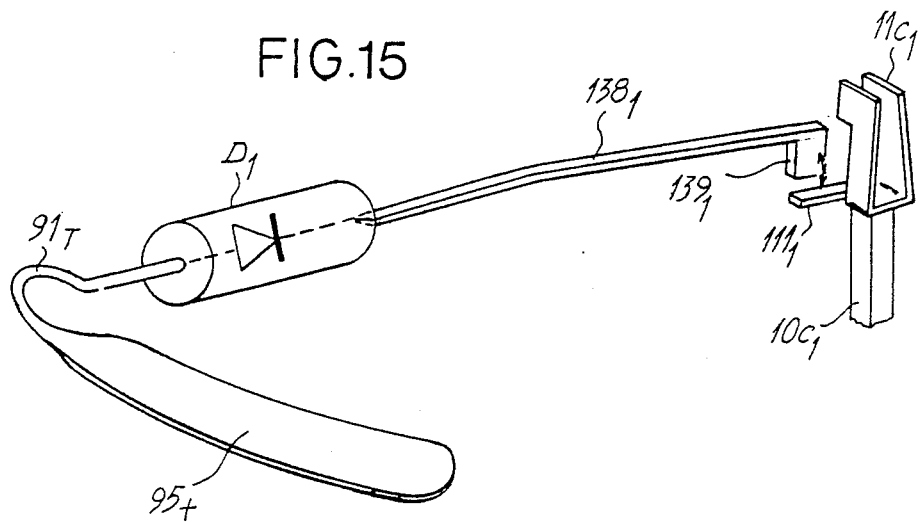

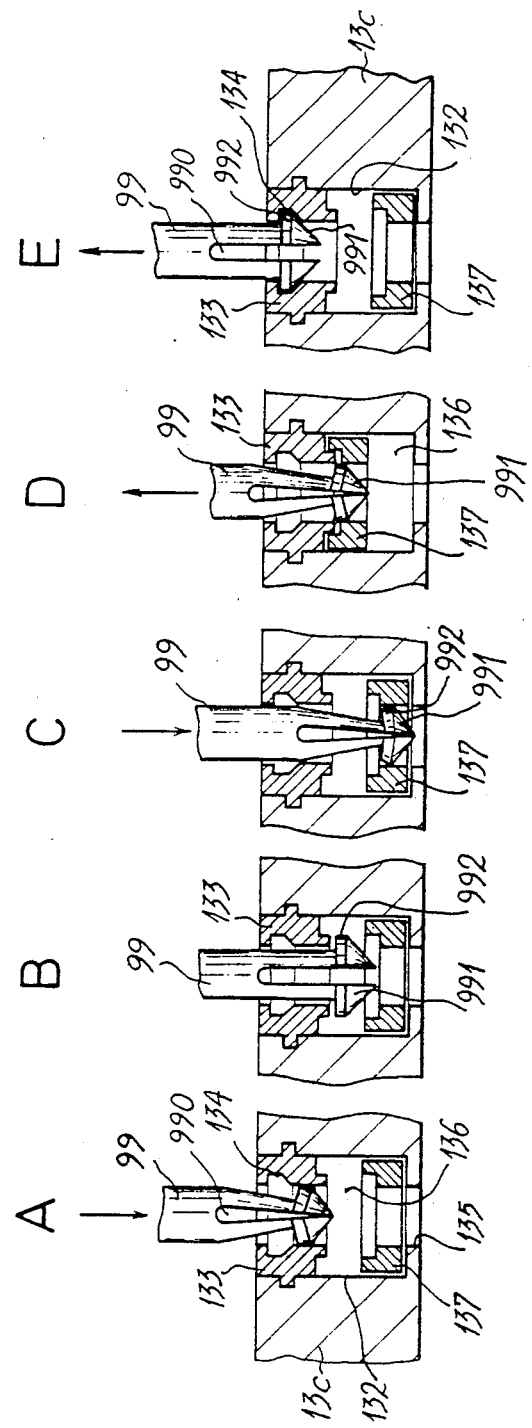

INTEGRATED CIRCUIT PACKAGE HOLDER

BACKGROUND OF THE INVENTION

1. Field of the Invention

The present invention relates to an integrated circuit package holder comprising conductive pins subjacent to the holder into which conductive pins of the package are plugged.

More particularly, this invention deals with safeguarding binary information in an integrated circuit, such as a memory, when power delivered by a main power source of a printed circuit board on which the holder is mounted, disappears for any reason. Provisions must be made for a spare power source that can replace the main power source in order to save the information stored in the memory, or at least an essential logic function performed by the integrated circuit, such as a clock signal generation.

2. Description of the Prior Art

Two solutions for mounting a spare power source that can feed integrated circuits have already been proposed. The spare source generally consists of several cells or miniature accumulators.

In a first solution, the spare power source is housed in a cylindrical or parallelepipedal flat package mounted directly on the printed circuit board. The spare power source package takes up some noticeable space on the printed circuit board thereby cutting the number of integrated circuits that could have been mounted on the board. Further, additional printed electrical conductors are required to connect the spare power source to integrated circuit supply terminals.

A second solution consists of housing the spare power source inside the integrated circuit package. The cost of the integrated circuit is then high. If the integrated circuit or the spare power source becomes defective, the whole package must be changed, as the spare source is not accessible alone.

In an embodiment of the second solution disclosed in international patent application No. WO 82/04359, the spare power source is removably inserted in an open recess located in one major overlying side of the integrated circuit package opposite the printed circuit board. Such package must be designed for each specific integrated circuit and replacement of the integrated circuit requires replacement of the whole package.

OBJECTS OF THE INVENTION

The main object of the invention is to obviate the drawbacks of mounting spare power sources as per the prior art.

Another object of the invention is to replace easily and inexpensively a spare power source located beneath a standard integrated-circuit package, without substantially increasing the space already provided for the integrated circuit package on a printed circuit board.

Another object of the invention is to fixedly connect conductive pins of an electronic circuit package to conductive pins of a package holder without any soldering.

Another object of the invention is to plug conductive pins of an electronic circuit package into conductive pins of a package holder and to lock the package and the holder by means of single pressures exerted onto the pakage.

Another object of the invention is to withdraw an electronic circuit package from a package holder containing a removable spare power source without withdrawing the spare source from the holder.

Another object of the invention is to monitor a voltage between terminals of a spare power source included in an electronic circuit package holder.

Another object of the invention is to display a discharge of a spare power source included in an electronic circuit package holder.

A further object of the invention is to inhibit a predetermined function of an integrated circuit package mounted on a package holder when a discharge voltage threshold of a spare power source contained in the hold is reached.

SUMMARY OF THE INVENTION

In accordance with the aforementioned objects, an integrated circuit package holder comprises conductive pins in which conductive pins of the package are respectively plugged, a recess preferably located between two conductive holder pin rows for receiving a removable spare power source to be interconnected between two predetermined holder pins in which supply pins of the package are plugged. The conductive holder pins have tails underlying to the holder and soldered to conductive strips of a printed circuit board and have contacts overlying to the holder and receiving the package pins.

Use is thus made in the invention of the space available between an integrated circuit package and the printed circuit board to insert a holder embodying the invention, having dimensions analogous with the package dimensions but including a spare power source. The height of an arrangement including the superposed package and holder is substantially small by the use of cells or miniature accumulators of the button type, as a spare power source, already used elsewhere for microcomputers, watches or electronic games. The cost of adding the spare source is whittled down even more in that the spare source relies on cells or accumulators that are widely available on the market. In addition, the spare source is removable from the holder thereby eschewing complete replacement of the holder or integrated circuit package whenever the spare source is defective.

According to other features of this invention, a cover removable from the holder is inserted between the circuit package and the holder. The cover is molded in a resilient plastic. The cover is provided with locking means for locking the cover and the holder to hold the removable spare source in the holder, and for locking the package and the holder in order to fixedly connect the package pins to the holder pins without any soldering.

An unlocking operation between the package and the holder can be accomplished without unlocking the cover from the holder in order to withdraw the package and hold the spare source in the holder. Locking and unlocking operations are simply carried out by pressures exerted onto the cover and the holder.

According to a further feature of the invention, the holder carries monitoring means for detecting a voltage across terminals of the spare power source lower than a predetermined source discharge threshold. The monitoring means visually and/or acoustically indicates a start of the discharge from the spare source with a view to replacing the spare source and to saving a function or a stored information of the integrated circuit.

According to a further feature of the invention, the holder carries means for inhibiting a predetermined function of the integrated circuit whenever the main supply source voltage of the printed circuit board across the supply pins disappears. When the integrated circuit is a memory, the function to be inhibited can be a writing authorization in the memory.

BRIEF DESCRIPTION OF THE DRAWING

The foregoing and other objects, features and advantages of the invention will be apparent from the following detailed description of several preferred embodiments of the invention with reference to the corresponding accompanying drawings in which:

FIG. 2 is a schematic side view of the holder shown in FIG. 1, mounted on a printed circuit board;

FIG. 3 is a schematic plan view of two holders as shown in FIG. 1, fed by a main power source of the printed circuit board;

FIG. 4 is a schematic plan view of three holders embodying the invention, one of which is a spare for the other two;

FIG. 5 is a detailed view in perspective of a holder upright in FIG. 4, showing one of supply conductive strips of the holder;

FIG. 6 is a schematic cross-sectional view of a holder embodying the invention, having a molded cavity to receive a spare power source;

FIG. 7 is a partial view in perspective of a holder embodying the invention, having a cavity sealed by a cover and receiving two juxtaposed button cells;

FIG. 12 is a detailed side view partially cross-sectional showing the holder and cover in FIG. 10, and depicting a supply pin of the holder after the cover and holder have been clipped shut by first locking means and before the integrated circuit package of the holder is locked;

FIGS. 14A to 14E are cross-sectional views of the second locking means at various stages of the cover and the package being shut and of the package being opened with respect to the holder, respectively;

FIG. 15 is a schematic view in perspective of an electrical connection between a contact reed relative to a cell and a positive supply pin of the holder as in FIG. 10;

DESCRIPTION OF THE PREFERRED EMBODIMENTS

Figure 1:
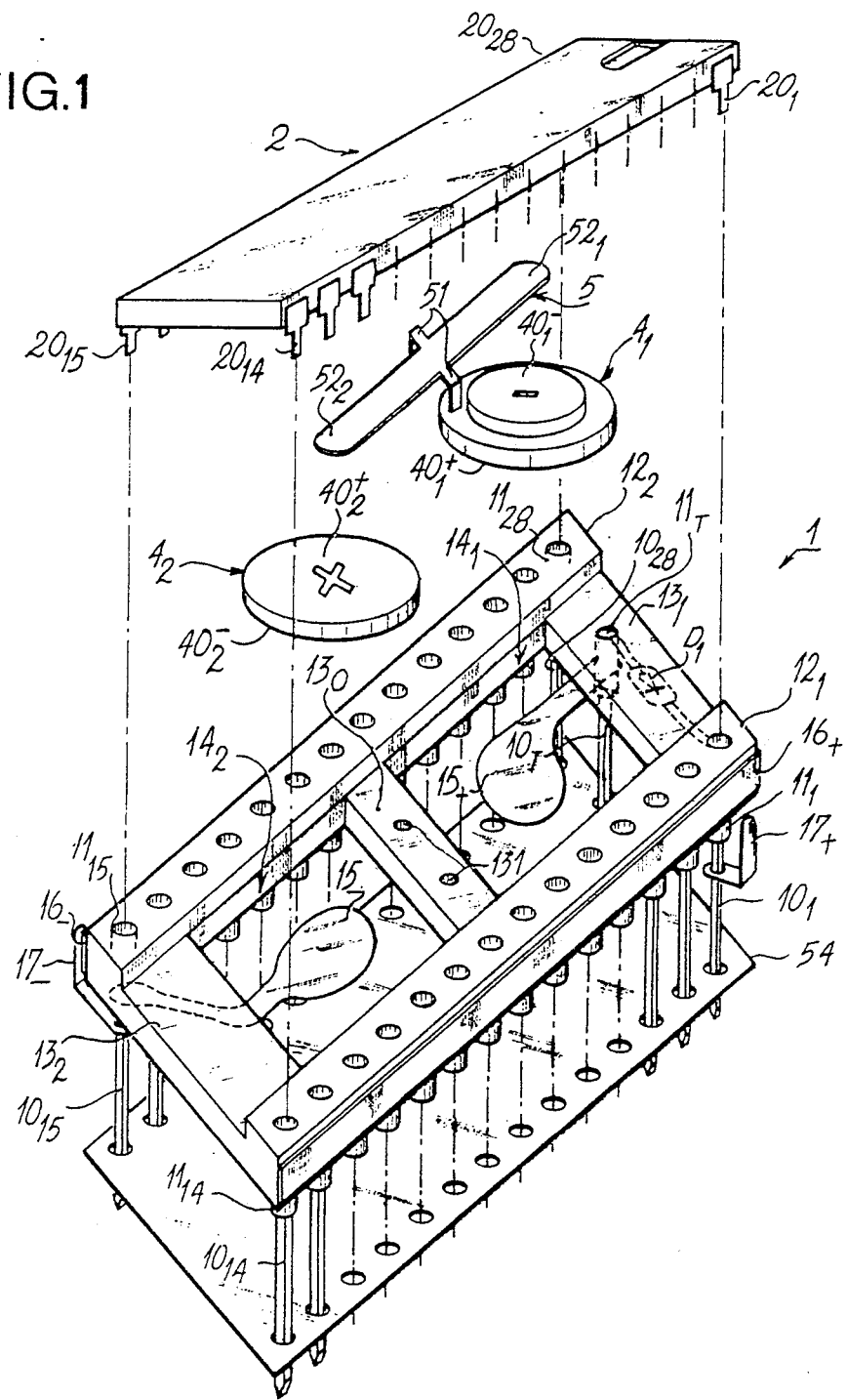
FIG. 1 is an exploded view in perspective of an integrated circuit package holder embodying the invention, comprising two head-to-tail and juxtaposed spare button cells having axes perpendicular to major sides of the package.

In a first embodiment mode depicted in FIG. 1, a holder 1 is intended to carry a standard integrated circuit package 2 having 28 metallic pins $20_1$ to $20_{28}$. Package 2 is parallelepipedal and flat in shape and is a dual-in-line package, i.e. the pins are arranged in two rows $20_1$ to $20_{14}$ and $20_{15}$ to $20_{28}$ extending vertically under longitudinal sides of package 2. Two adjacent pins in either of the two rows are separated by a standard pitch p=2.54 mm for integrated circuits. At least an integrated circuit chip is encapsulated in package 2 and can be a CMOS-technology memory such as a random access memory RAM.

Holder 1 is made of moulded plastic and is also parallelepipedal in shape with dimensions substantially greater than those of package 2. Holder 1 also comprises two longitudinal rows of vertical metallic pins $10_1$ to $10_{14}$ and $10_{15}$ to $10_{28}$ protruding beneath the holder. Each pin $10_1$ to $10_{28}$ of the holder is terminated upwardly by a sleeve $11_1$ to $11_{28}$ having, for example, small vertically extending resilient conductive strips. Sleeve $11_1$ to $11_{28}$ is integral with holder 1 in a vertically extending suitable hole in holder 1 in order to receive a respective vertical pin $20_1$ to $20_{28}$ of package 2 duly plugged therein. Electrically conductive pins $10_1$ to $10_{28}$ are respectively connected by wrapping or soldering to electrically conductive strips, such as a strip 30, on a printed circuit board 3 shown in FIG. 2 or 3. In the latter case, lower bases of sleeves $11_1$ to $11_{28}$ butt against the surface of the printed circuit board above metal-plated holes in the board through which pins $10_1$ to $10_{28}$ run. As schematically shown in FIG. 2, holder 1 is located between package 2 and board 3, and each pin $10_1$ to $10_{28}$ electrically links a respective pin $20_1$ to $20_{28}$ to at least one conductive strip printed on board 3, such as conductive strip 30.

Holder 1 has a U-shaped cross-section with upwardly and vertically extending arms and oriented towards package 2. The longitudinal arms of the U-shaped cross-section form side-members $12_1$ and $12_2$ carrying vertical holes to respectively contain sleeves $11_1$ to $11_{14}$ and $11_{15}$ to $11_{28}$. A central cross-member $13_0$ and two end cross-members $13_1$ and $13_2$ of holder 1 tie side-members $12_1$ and $12_2$ and together form two square slots $14_1$ and $14_2$.

Slots $14_1$ and $14_2$ constitute recesses to respectively receive two miniature cells of the button type, $4_1$ and $4_2$, constituting a spare power source. The cells can be known types based on silver, mercury or preferably lithium, frequently used in microelectronics. Disk-shaped metallic surfaces on the surfaces of each cell $4_1$ and $4_2$ make up a positive terminal $40_1{}^+$, $40_2{}^+$ and a negative terminal $40_1{}^-$, $40_2{}^-$ of the cell. As illustrated in FIG. 1, the metallic surface forming the cell positive terminal fully covers one side of the cell and an external cylindrical contour of the cell, whereas the metallic surface forming the cell negative terminal is a projecting surface that is concentric with the other side of the cell and is smaller in diameter than said cell side.

Each cell can be replaced by a miniature battery of accumulators, in lead or cadmium/nickel for instance. The accumulator battery is then rechargeable from a main power source MPS to the printed circuit.

Generally, each elementary spared power source such as a cell $4_1$, $4_2$ is a small sealed housing and delivers a voltage equal at the most to 1.5 volt. Two series-connected cells produce a voltage of some 2 to 3 volts that can take over from a main power source in the event of failure in an integrated circuit.

Cells $4_1$ and $4_2$ are removably inserted in slots $14_1$ and $14_2$ in holder 1 and are wired up in series as shown in FIG. 3.

Positive terminal $40_1{}^+$ of first cell $4_1$ is connected to an anode of a clamping diode $D_1$ via a substantially horizontally extending contact reed $15_+$ and a sleeve $11_T$ of a test pin $10_T$ of holder 1. Reed $15_+$ is pan-shaped and made of a semi-rigid or resilient electrically conductive material. A circular portion of reed $15_+$ is subject to the middle of slot $14_1$ and bears disk-shaped terminal $40_1{}^+$. A tail of reed $15_+$ extends substantially longitudinally in holder 1 and is soldered to the lower base of sleeve $11_T$ of test pin $10_T$ situated beneath cross-member $13_1$ between pins $10_1$ and $10_{28}$. The diode $D_1$ is preferably fully embedded in cross-member $13_1$ although, in another embodiments, the diode $D_1$ can be laid on cross-member $13_1$. The anode of diode $D_1$ is soldered to sleeve $11_T$. A cathode of diode $D_1$ is soldered to sleeve $11_1$ of pin $10_1$. Sleeve $11_1$ receives package pin $20_1$ which forms a positive supply terminal for the integrated circuit. As shown in FIG. 3, pin $10_1$ is soldered to a conductive strip $30_+$ printed on board 3. The strip $30_+$ is connected to a positive terminal $MPS_+$ of the printed circuit main power source MPS via a clamping diode $D_2$ on board 3. An anode of diode $D_2$ is connected to the positive main supply terminal $MPS_+$, and a cathode of diode $D_2$ is connected to negative terminal $40_1{}^+$ of cell $4_1$ through printed strip $30_+$ and diode $D_1$.

A negative supply terminal of the integrated circuit in package 2 is made up of pin $20_{15}$ diagonally opposite positive supply pin $20_1$. Pin $20_{15}$ is connected to negative terminal $40_2{}^-$ of second cell $4_2$ also via a pan-shaped contact reed $15_-$ made of a resilient electrically conductive material. A circular portion of reed $15_-$ is subjacent to the middle of second slot $14_2$ and receives negative dish-shaped terminal $40_2{}^-$ of cell $4_2$. A tail of reed $15_-$ is bent and soldered to the lower base of sleeve $11_{15}$ of pin $10_{15}$ beneath side-member $12_2$. As depicted in FIG. 3, pin $10_{15}$ is soldered to a conductive strip $30_-$ printed on board 3 connected directly to a ground referred terminal $MPS_-$ of the main supply MPS. The main power source MPS and spare power source $4_1$–$4_2$ are connected in parallel between terminals $20_1$ and $20_{15}$ by means of clamping diodes $D_1$ and $D_2$, whereby it is possible to hold a virtually constant supply voltage in the event of failure in the main power source.

As shown in FIG. 1, negative terminal $40_1{}^-$ of first cell $4_1$ is connected to positive terminal $40_2{}^+$ of second cell $4_2$ via a connecting plate 5 made of a resilient electrically conductive material. Plate 5 is rectangular and extends longitudinally on either side of central cross-member $13_0$. Two downwardly extending transverse tabs 51 from the middle of plate 5 plug into two vertical holes 131 in central cross-member $13_0$ and, simultaneously, contact tips $52_1$ and $52_2$ of plate 5 come into pressure contact with cell terminals $40_1{}^-$ and $40_2{}^+$. In holder 1, each cell $4_1$, $4_2$ is thus held between respective reed $15_+$, $15_-$ and respective tips $52_1$, $52_2$ of plate 5. Reeds $15_+$ and $15_-$ can be substantially bent upwards, and half-portions of plate 5 on either side of tabs 51 can be substantially bent downwards to pinch the cells more tightly. As shown in FIG. 2, cells $4_1$ and $4_2$ are substantially thicker than holder 1, whereby a major surface underlying the package 2 is in pressure contact with plate 5, so that package 2 and holder 1 with the cells form an integral block. When necessary, the holder and package 2 assembly can be reinforced by soldering pins $20_1$ to $20_{28}$ to sleeves $11_1$ to $11_{28}$ respectively.

The capacitance of spare power source $4_1$–$4_2$ can be measured across test pin $10_T$ and supply pin $10_{15}$.

Cell replacement is simply carried out by withdrawing package 2 from holder 1, i.e. by withdrawing pins $20_1$ to $20_{22}$ from sleeves $11_1$ to $11_{28}$ and then by lifting plate 5 such that tabs 51 are disengaged from holes 131. Package 2 is withdrawn using a known multi-pin extractor pliers.

In another embodiment, the connecting plate 5 runs across the central cross-member $13_0$ and is secured thereto and has contact ends $52_1$ and $52_2$ receiving in pressure contact the cell terminals $40_1{}^+$ and $40_1{}^-$. The contact reeds are replaced by two small contact reeds removable from holder 1 and analogous with a small connecting plate $52_1$ shown in FIG. 18. The small contact reeds are plugging into metallized holes in the end cross-member $13_1$ and $13_2$ respectively and are applied against the cell terminals $40_1{}^-$ and $40_2{}^+$ in the slots $141_1{}^+$ and $14_1{}^-$. The metallized holes are respectively connected to the supply pins $10_1$ and $10_{15}$ through conductors embedded in holder cross-member $13_1$ and $13_2$. The small contact reeds can be sticked beneath the package 2.

FIG. 1 also shows a rectangular sheet of electrically insulating material 54. Sheet 54 extends horizontally between holder 1 and printed circuit board 3, and carries holes through which pins $10_1$ to $10_{28}$ of the holder fit. Once pins $10_1$ to $10_{28}$ have been soldered to board 3, and the holder 1 and package 2 have been assembled as depicted in FIG. 2, contact reeds $15_+$ and $15_-$ can be substantially pushed towards board 3. Sheet 54 then electrically insulates reed $15_+$ in contact with positive terminal $40_1{}^+$ of cell $4_1$ and reed $15_-$ in contact with negative terminal $40_2{}^-$ of cell $4_2$ from the printed board strips located beneath holder 1.

Holder 1 further comprises two metallized supply strips $16_+$ and $16_-$ that are secured to the external vertical and longitudinal edges on side-members $12_1$ and $12_2$ respectively, and two right-angle metallic spades $17_+$ and $17_-$ having outwardly extending horizontal flats through which vertical supply pins $10_1$ and $10_{15}$ run and with which the pins $10_1$ and $10_{15}$ are soldered respectively. Strips $16_+$ and $16_-$ and spades $17_+$ and $17_-$ are provided such that several integrated-circuit holders embodying the invention that do not embody a spare power source can be fed from a spare power source in another holder embodying the invention.

In the example shown in FIG. 4, three integrated circuit holders 1A, 1B and 1C analogous with holder 1 embodying the invention are mounted between parallel printed strips $30_+$ and $30_-$ on a printed circuit board 3. Strips $30_+$ and $30_-$ are directly connected to the positive terminal $MPS_+$ and the negative terminal $MPS_-$ on the main power source MPS normally feeding integrated circuits on the holders. In relation to each holder 1A, 1B, 1C, positive supply pin $10_1$ of the holder is soldered to one end of a short printed conductive strip $31_+$ having another end lying opposite strips $30_+$, and negative supply pin $10_{15}$ of the holder is soldered to one end of a second short printed conductive strip $31_-$ having another end lying opposite conductor $30_-$.

It is assumed here that only the first holder 1A contains a spare power source having two cells $4_1$ and $4_2$. The main power source MPS feeds the integrated circuit on the holder 1A normally via a clamping diode $D_2$ interconnected to strip $30_+$ and to the second end of respective short strip $31_+$, and via a strap $st_-$ extending between strip $30_-$ and the second end of short strip $31_-$.

Electrical connections must be made for an integrated circuit carried by a holder having no spare power source, such as the holder 1B, to be supplied by spare source $4_1$-$4_2$ in the holder 1A should a failure occur, or normally from the main power source MPS. For each of holders 1A and 1B, upwardly extending flats of right-angle spades $17_+$ and $17_-$ are respectively soldered to conductive strips $16_+$ and $16_-$. Ends of a first strap $ST_+$ are soldered to the near-by ends of strips $16_+$ on the holders 1A and 1B respectively, and the ends of a second strap $ST_-$ are soldered to the near-by ends of strips $16_-$ on the holders 1A and 1B respectively. Consequently, the positive supply terminal of the integrated circuit carried by the holder 1B is connected to the main power source positive terminal $MPS_+$ across conductive members $11_1$, $10_1$, $17_+$ and $16_-$ of the holder 1B, the strap $ST_+$, conductive members $16_+$, $17_+$ and $10_1$ of the holder 1A, short strip $31_+$ and diode $D_2$ related to the holder 1A and printed strip $30_+$, and is connected to positive terminal $40_1+$ of spare power source $4_1$-$4_2$ in the holder 1A across conductive members $11_1$, $10_1$, $17_+$ and $16_+$ in holder 1B, the strap $ST_+$ and conductive members $16_+$, $17_+$, $10_1$, $11_1$, $D_1$, $11_T$ and $15_+$ in the holder 1A. The negative supply terminal of the integrated circuit carried by holder 1B is connected to the main power source negative terminal $MPS_-$ across conductive members $11_{15}$, $10_{15}$, $17_-$ and $16_-$ of the holder 1B, the strap $ST_-$, conductive members $16_-$, $17_-$ and $10_{15}$ of the holder 1A, short strip $31_-$ and the strap $st_-$ related to the holder 1A, and strip $30_-$ and is connected to negative terminal $40_2-$ of spare power source $4_1$-$4_2$ in the holder 1A across conductive members $11_{15}$, $10_{15}$, $17_-$ and $16_-$ of the holder 1B, the strap $ST_-$ and conductive members $16_-$, $17_-$, $10_{15}$ and $15_-$ of the holder 1A. The connections around pin $10_{15}$ of the holder 1A are shown in detail in FIG. 5.

If an integrated circuit is carried by a holder having no spare power source, such as the holder 1C, and is directly fed from the main power source MPS by the inclusion of a short strap $st_+$ between printed strip $30_+$ and short printed strip $31_+$ related to the holder 1C and by the inclusion of a second short strap $st_-$ between printed strip $30_-$ and small printed strip $31_-$ related to the holder 1C, one of two following solutions is possible to feed the integrated circuit from a spare source. A first solution consists of replacing the strap $st_+$ related to the holder 1C by a clamping diode, such as diode $D_2$, and of inserting two miniature spare cells into the holder 1C. A second solution consists of removing the straps $st_+$ and $st_-$ related to the holder 1C and of introducing two straps, such as straps $ST_+$ and $ST_-$, between strips $16_+$ and $16_-$ of the holder 1C and between strips $16_+$ and $16_-$ of a neighbouring holder, such as the holder 1B, that is supplied by a spare source, respectively.

Conductive strips $16_+$ and $16_-$ and conductive spades $17_+$ and $17_-$ of the holder embodying the invention serve also for manually testing each of the cells contained in the holder.

Further embodiments of the integrated circuit package holder structure can also be envisioned for containing a suitable number of cells or miniature accumulator batteries depending on the supply voltage of the integrated circuit. A holder can carry four button cells when each cell $4_1$, $4_2$ is replaced by two slim-line cells superposed and connected in series, as will be seen in reference to FIGS. 11C and 11D. A holder can also offer three recesses that each receive a thick button cell or a pair of slim-line button cells, as will be seen in reference to FIGS. 11E to 11H. A holder can further offer two recesses each containing three very slim bottom cells stacked and connected in series. An increase in the number of cells is achieved by selecting cells of varying thickness. In all events, dimensions of the holder are matched with dimensions of the integrated-circuit package, and in particular the package pin number that can, for instance, be 14, 16, 20, 28 or 40, or 64 for a microprocessor.

Slots $14_1$ and $14_2$ can be closed off downwardly by molding in a bottom 140 to form two cavities, as shown schematically in FIG. 6; bottom 140 replaces insulating sheet 54 shown in FIGS. 1 and 2. Preferably, the horizontal cross-section of the recesses, such as slots $14_1$ and $14_2$, or cavities corresponds to the horizontal cross-section of the cells or accumulators in order to prevent any possible cell or accumulator movement in the holder. Plate 5 coupling cells $4_1$ and $4_2$, as depicted in FIG. 1, can be replaced by an adhesive copper film that is bonded beneath package 2; the copper film has ends coming into contact with terminals $40_1-$ and $40_2+$ when pins $20_1$ to $20_{28}$ are plugged into sleeves $11_1$ to $11_{28}$.

A description is now given in detail of two embodiments of two-cell holders to enclose the cells hermetically, and one holder embodiment carrying at least three cells where the holder and the integrated circuit package can be easily and solidly assembled without any soldering.

In the embodiment illustrated in FIG. 7, two button cells, such as cell $4_2$, are respectively lodged in two molded circular cavities, such as cavity $14a_2$, lying parallel to major side of a 28-pin holder 1a. A discoid conductor $52a_2$ is printed on the bottom of cavity $14a_2$ or takes the form of a downwardly resilient circular metallic plate on the bottom of cavity $14a_2$. Conductor $52a_2$ is connected to an analogous conductor lodged on a bottom side of another molded cavity (not shown) through a conductor $5a$ embedded in holder 1a. Cavity 14a has a diameter substantially equal to the diameter of button cell $4_2$ and a depth substantially equal to the sum of the thicknesses of cell $4_2$ and a discoid cover $6_2$ both having a same outside diameter. To shut cavity $14a_2$ containing the cell $4_2$, cover $6_2$ is locked in place by a bayonet arrangement. Two locking lugs 61 and 62 are diametrically opposed and extend from the circumference of the cover facing cavity $14a_2$. An inner surface of cover $6_2$ facing terminal $40_2-$ of cell $4_2$ carries a discoid printed conductor or a resilient circular metallic plate 63 fixed to the cover. Conductor 63 is extended by a tab 64 lying subjacent to lug 62. Provided at the circumference of cavity $14a_2$ are two diametrically opposed slits 141 and 142 and two blind circular grooves 143 and 144 also diametrically opposed and each running for a quarter of a turn. An end of each groove 143, 144 is formed by a respective slit 141, 142 designed to receive respective lug 61, 62 and another end of each groove forms a stop 145, 146 for respective lug 61, 62 after cover $6_2$ has been rotated through ninety degrees. Before stop 146, an end of a conductor $15a_-$ emerges in the bottom of groove 144. Conductor $15a_-$ is fully embedded in holder $1a$ and has another end connected to sleeve $11_{15}$ of negative supply pin $10_{15}$. Once cover $6_2$ has been completely shut on cavity $14a_2$, tab 64 on cover $6_2$ engages conductor $15a_-$, thereby linking supply terminal $10_{15}$ to negative terminal $10_2-$ of cell $4_2$. As far as cell $4_1$ is concerned, not shown in FIG. 7, a conductor analogous with conductor $15a$ connects terminal $40_1+$ of cell $4_1$ to sleeve $11_T$ of test pin $10_T$ via electrically conductive tab and disk secured on the underside of a respective cover analogous with cover $6_2$.

Conductive disks $52a_2$ and 63 are preferably resilient conductive plates with opposing deflections in order to ease withdrawal of the cover followed by extraction of the cell.

A surface of the holder $1a$ in which the cavities are included, such as cavity $14a_2$, housing cells $4_1$ and $4_2$ can be the holder $1a$ upper surface facing integrated circuit package 2 or the holder $1a$ lower surface facing printed circuit board 3, in which case pins $10_1$ to $10_{28}$ of the holder are sufficiently long to easily access to covers, such as cover $6_2$, as shown in FIG. 7.

Another holder substantially modified with respect to holder $1a$ in the aforegoing description in reference to FIG. 7 is now described. This other holder comprises just one cover, such as cover $6_2$, shutting off corresponding cavity $14a_2$ that communicates with the first cavity receiving cell $4_1$ through a passage-way having a width at least equal to the diameter of cells $4_1$ and $4_2$. The first cavity has parallel bottom wall and underwall formed by the full major sides of holder $1a$. The two cavities thus form a continuous oblong cavity, accessible only via the opening to cavity $14a_2$. In this case, cell $4_1$ is inserted firstly into second cavity $14a_2$ and then pushed right into the other cavity along the passageway. Second cell $4_2$ is inserted in cavity $14a_2$ that then is closed off by cover $6_2$. A small longitudinal hole between the first cavity and one transverse edge of holder $1a$ lateral thereto makes it possible to insert a rod for the purpose of working cell $4_1$ along towards cavity $14a_2$ so that cell $4_1$ may be withdrawn from holder $1a$.

Figure 8:
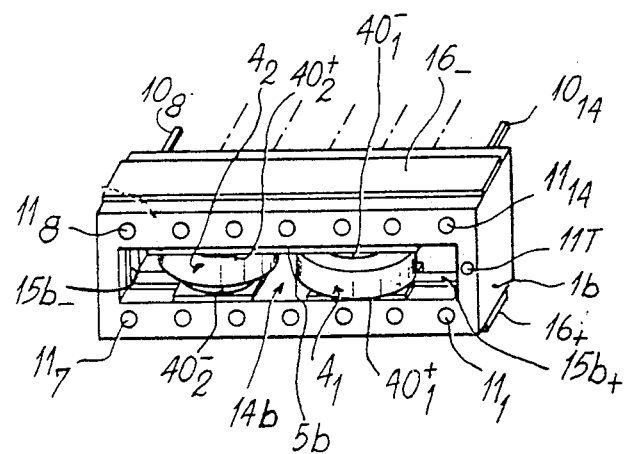
FIG. 8 is a schematic view in perspective of another holder having a cavity to receive two head-to-tail and juxtaposed button cells having axes parallel to major sides of the integrated circuit package.
Figure 9:
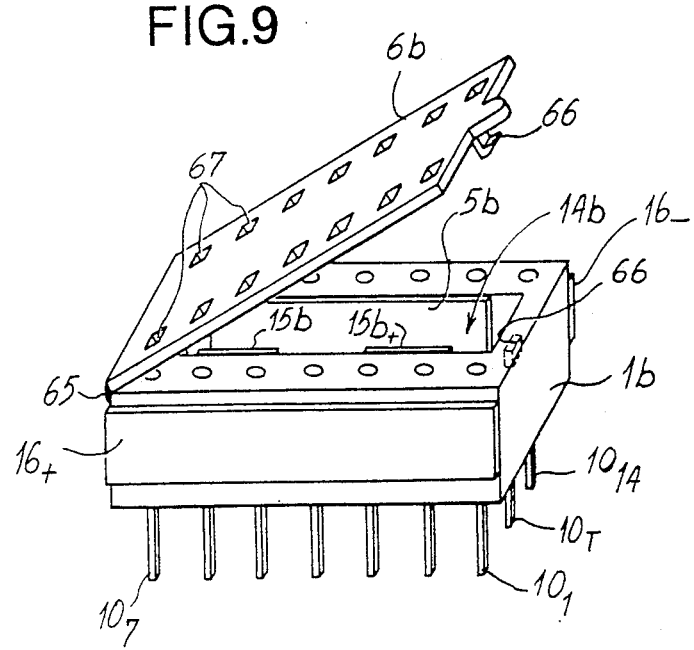
FIG. 9 is a schematic view in perspective of the holder shown in FIG. 8, fitted with a cover shutting off the cavity.

In a further embodiment depicted schematically in FIGS. 8 and 9, button cells $4_1$ and $4_2$ are vertically arranged and juxtaposed in a single parallelepipedal cavity $14b$ in a holder $1b$. The axes of the cells run parallel to the major surfaces of package 2 and to printed circuit board 3. Holder $1b$ carries 14 pins $10_1$ to $10_{14}$ with sleeves $11_1$ to $11_{14}$ to receive 14 pins $20_1$ to $20_{14}$ of an integrated circuit package (not shown). Vertical longitudinal major sidewalls of holder $1b$ respectively bear two rows of pins $10_1$ to $10_7$ and $10_8$ to $10_{14}$. The sleeves of diagonally opposed pins $10_1$ to $10_8$ respectively receive positive and negative supply pins $20_1$ and $20_8$ of the integrated circuit package.

Cavity $14b$ has a width substantially equal to the thickness of cells $4_1$ and $4_2$. The cells are also arranged head-to-tail. Negative terminal $40_1-$ of cell $4_1$ and positive terminal $40_2+$ of cell $4_2$ are in pressure contact with ends of a conductor $5b$ printed on or added to a vertical, longitudinal inner major surface of cavity $14b$, whereas positive terminal $40_1+$ of cell $4_1$ and negative terminal $40_2-$ of cell $4_2$ are in pressure contact with two respective resilient conductors $15b_+$ and $15b_-$ added to another vertical, longitudinal inner major surface in cavity $14b$; conductor $15b_+$ is connected to sleeve $11_T$ of test pin $10_T$, and conductor $15_-$ is connected to negative supply pin $10_8$.

Holder $1b$ presents a non-standard thickness substantially greater than the diameter of the button cells. The interior of cavity $14b$ is accessible from the top of the holder, on the integrated circuit package side.

A cover $6b$ is hinged to holder $1b$ about a molded hinge 65 to shut cavity $14b$ and hold the cells therein in the absence of the integrated circuit package. As shown in FIG. 9, cover $6b$ is closed downwardly on the top of the holder $1b$ by a catch and notch arrangement 66. A series of holes 67 run through the longitudinal edges of cover $6b$ to allow respective pins $20_1$ to $20_{14}$ of the package freely through the respective sleeves $11_1$ to $11_{14}$ of holder $1b$. In practice, a holder, such as holder $1b$ illustrated in FIGS. 8 and 9, is generally intended for carrying an integrated circuit package with 14, 16, 18, 20 or 22 pins.

Figure 10:
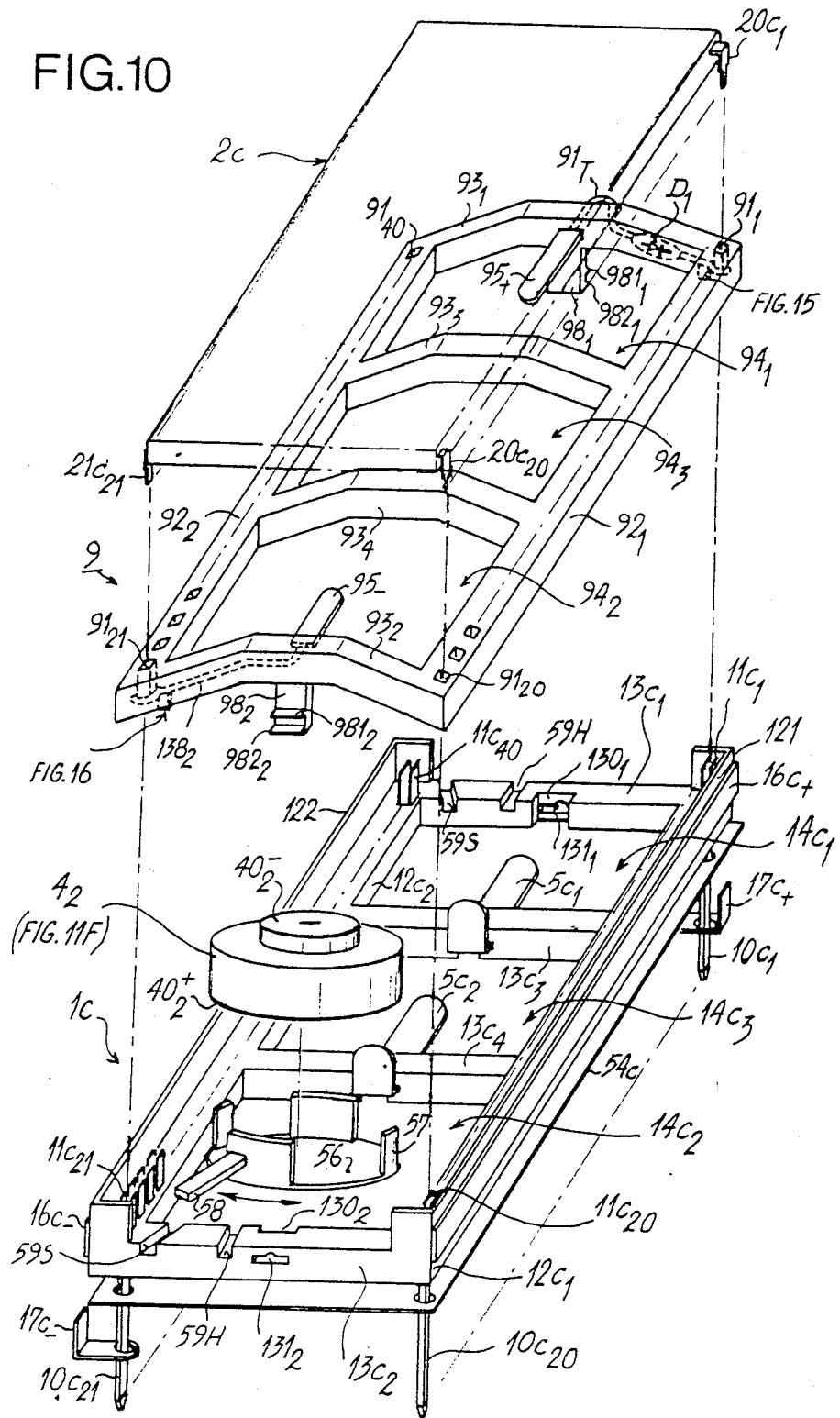
FIG. 10 is an exploded view in perspective of another integrated circuit package holder embodying the invention, housing three juxtaposed spare button-cells, the holder being assembled with a removable cover intended for connecting and disconnecting integrated circuit pins and the holder pins with no soldering, simply by pressing on the package.

FIG. 10 shows a holder $1c$ carrying an integrated circuit package $2c$ having two rows of 20 pins $20c_1$ to $20c_{20}$ and $20c_{21}$ to $20c_{40}$. Holder $1c$ is molded out of plastic to a parallelepipedal shape analogous to that of holder 1 depicted in FIG. 1. However, holder $1c$ offers three square slots $14c_1$, $14c_2$ and $14c_3$ longitudinally aligned between two side-members $12c_1$ and $12c_2$ and two end cross-members $13c_1$ and $13c_2$. Slot $14c_3$ is in the middle of the holder and separated from the other two slots $14c_1$ and $14c_2$ by two intermediate cross-members $13c_3$ and $13c_4$. Each slot $14c_1$, $14c_2$, $14c_3$ is designed to receive a button cell $4_1$, $4_2$, $4_3$ having a diameter substantially smaller in length than a side of the square slot. Only cell $4_2$ is shown in FIG. 10. Holder $1c$ comprises two longitudinal rows of vertical metallic pins $10c_1$ to $10c_{20}$ and $10c_{21}$ to $10c_{40}$ protruding from the underside of side-members $12c_1$ and $12c_2$ and having vertical sleeves $11c_1$ to $11c_{20}$ and $11c_{21}$ to $11c_{40}$ standing proud on side-members $12c_1$ and $12c_2$. Sleeves $11c_1$ to $11c_{40}$ are designed to receive tips of pins $20c_1$ to $20c_{40}$ of integrated circuit package $2c$. Pins $10c_1$ and $10c_{21}$ are diagonally opposed across the holder and receive package pins $20c_1$ and $20c_{21}$ forming positive and negative supply terminals of the integrated circuit respectively. In an analogous fashion with the embodiment in FIG. 1, right-angled metallic spades $17c_+$ and $17c_-$ are soldered to supply pins $10c_1$ and $10c_{21}$ and can be soldered to metallic supply strips $16c_+$ and $16c_-$ extending along outer vertical longitudinal edges of side-members $12c_1$ and $12c_2$. A rectangular sheet $54c$ of electrically insulating material is also laid beneath holder $1c$ such that pins $10c_1$ to $10c_{40}$ run through the sheet $54c$.

Figure 11:
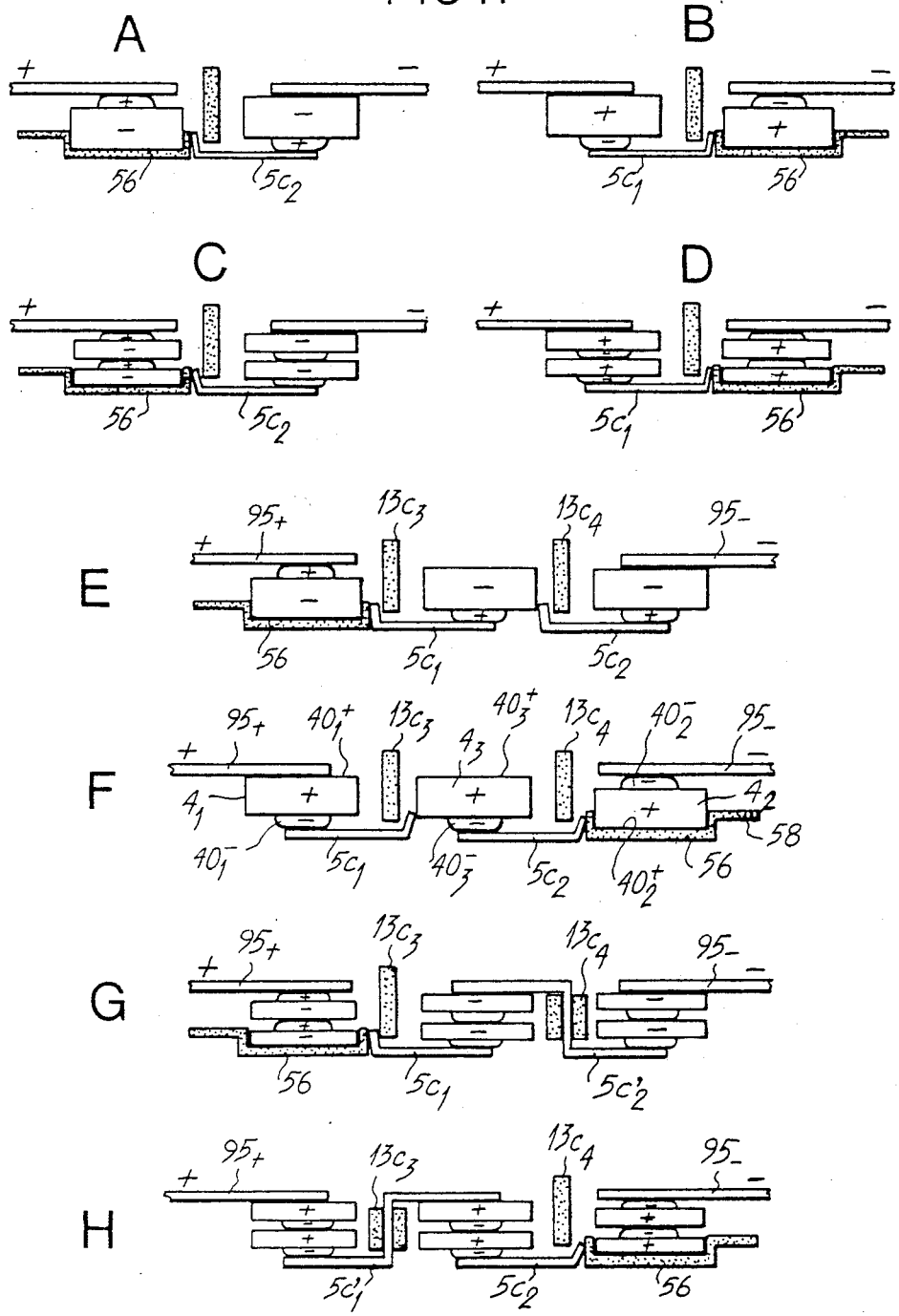
FIGS. 11A to 11H schematically show various cell arrangements in holders having two or three cell recesses and a spare power source switch shown in FIG. 10, respectively.

It is assumed hereinafter that cells $4_1$, $4_2$ and $4_3$ are series-connected as shown in FIG. 11F: cells $4_1$ and $4_3$ carry upwardly extending positive terminals $40_1+$ and $40_3-$ and cell $4_2$ carries a downwardly extending positive terminal $40_2+$. Two right-angled and resilient metallic connecting plates $5c_1$ and $5c_2$ are provided to connect cells $4c_1$ and $4c_2$ and cells $4c_3$ and $4c_2$ respectively. Plates $5c_1$ and $5c_2$ include horizontally extending flat portions that pass through the middles of intermediate cross-members $13c_3$ and $13c_4$ and that extend at least up to the center of slots $14c_1$ and $14c_3$. Plates $5c_1$ and $5c_2$ further include vertically extruding flat portions that extend upwards in the vicinity of cross-members $13c_3$ and $13c_4$ in slots $14c_3$ and $14c_2$ respectively. When cells $4_1$, $4_2$ and $4_3$ are inserted in respective slots $14c_1$, $14c_2$ and $14c_3$, as depicted in FIG. 11F, the horizontal flat portions of plates $5c_1$ and $5c_2$, preferably substantially bent upwardly, come into pressure contact with small negative terminals $40_1-$ and $40_3-$ of cells $4_1$ and $4_3$ and carry cells $4_1$ and $4_3$, whereas the vertical flat portions of plates $5c_1$ and $5c_2$, preferably substantially bent towards cross-member $13c_2$, are pressed against the outer cylindrical metallic circumferences of positive terminals $40_3+$ and $40_2+$ of cells $4_3$ and $4_2$ respectively.

Cell $4_2$ is borne by a cylindrical bottom cap 56 molded from an electrically insulating material. Cap 56 acts as a switch between spare power source $4_1$-$4_3$-$4_2$ and supply pins $10c_1$ and $10c_2$ in order to bring the spare source into play or not. Cap 56 comprises a circular base against which positive terminal $40_2+$ of cell $4_2$ is pressed. An upwardly extending cylindrical wall of cap 56 is castellated to form at least two diametrically opposed cylindrical segments that are resilient towards the center of the cap, or preferably as illustrated in FIG. 10, to form four cylindrical segments 57 diametrically opposed two by two such that the circular metallic circumference of terminal $40_2+$ can be clasped therein. Segments 57 are substantially smaller height-wise than cell $4_2$, and cap 56 is substantially equal in outside diameter to the length of the square slot $14c_2$ sides. Under these conditions, cap 56 together with cell $4_2$ can turn with a slight interference fit between the inside walls of slot $14c_2$, and the small vertical flat portion of connecting plate $5c_2$ under the effect of its own deflection comes alternately into mechanical contact with one of insulating segments 57 to disconnect terminal $40_2+$ of cell $4_2$ from terminal $40_3-$ of cell $4_3$, and thus switch off the spare power supply, and alternately into electrical contact with the circular metallic circumference of terminal $40_2+$ to switch the spare power supply on and thereby series-connect cells $4_1$, $4_2$ and $4_3$ across pins $10c_1$ and $10c_{21}$. These disconnection and connection operations are in fact performed by rotating cap 56 through approximately one quarter of a turn, use being made therefor of a lever 58 projecting radially outwards from one of segments 57. A resilient free end of lever 58 protrudes substantially from holder 1c over end cross-member $13c_2$ and can be slotted either in an oblique groove 59S close to pin $10c_{21}$ in cross-member $13c_2$, or in a substantially transverse groove 59H in cross-member $13c_2$ between the mid-point thereof and groove 59S. Grooves 59S and 59H constitute stop-notches to halt rotation of cap 56 and respectively correspond to emplacements of segment 57 diametrically opposite lever 58 in which segment 57 is separated from connecting plate $5c_2$ and is in mechanical contact with connecting plate $5c_2$.

As shown in FIG. 10, holder 1c is associated with a removable cover 9 to permit easy connection and disconnection, without any soldering, of pins $20c_1$ to $20c_{40}$ of integrated circuit package 2c with respect to sleeves $11c_1$ to $11c_{40}$ of holder 1c on the one hand, and to hold cells $4_1$, $4_2$ and $4_3$ in place inside holder 1c particular when there is no package 2c.

Cover 9 consists of a molded plastic rectangular frame having length and width substantially smaller than holder 1c and formed of two side-members $92_1$ and $92_2$ and two end cross-members $93_1$ and $93_2$. Two intermediate cross-members $93_3$ and $93_4$ split cover into three square slots $94_1$, $94_3$ and $94_2$ that match slots $14c_1$, $14c_3$ and $14c_2$. Cross-members $93_1$ to $93_4$ assume an upwardly convex cross-section, e.g. a trapezoidal cross-section as shown in FIG. 10, such that only side-members $92_1$ and $92_2$ rest on holder 1c, i.e. on side-members $12c_1$ and $12c_2$ when cover 9 lies in place on holder 1c. Cover 9 is then secured in place between thin longitudinal sidewalls 121 and 122 running along the edge of holder 1c, extending side members $12c_1$ and $12c_2$ upwards and having right-angled portions at the four corners of the holder. In the embodiment shown in FIG. 10, two resilient locking lugs $98_1$ and $98_2$ extend vertically and downwardly from the middle of end cross-members $93_1$ and $93_2$ and carry pairs of outwardly upper and lower horizontal ribs $981_1$ and $981_2$ and $982_1$ and $982_2$ to cooperate with inwardly extending central vertical grooves $130_1$ and $130_2$ and horizontal rectangular apertures $131_1$ and $131_2$ embodied in cross-members $13c_1$ and $13c_2$ respectively. The distance between upper rib $982_1$, $982_2$ and lower rib $981_1$, $981_2$ on each lug $98_1$, $98_2$ is equal to half the height of end cross-members $13c_1$ and $13c_2$. Locking lugs $98_1$ and $98_2$ slide in grooves $130_1$ and $130_2$ inside the slots $14c_1$ and $14c_2$, and the pairs of ribs $981_1$-$982_1$ and $981_2$-$982_2$ clamp around central portions of cross-members $13c_1$ and $13c_2$ above apertures $131_1$ and $131_2$ when cover 9 is pressed down on holder 1c in order to lock the cover and holder together, as depicted in FIG. 12.

Cover side-members $92_1$ and $92_2$ carry two series of square-section vertical holes $91_1$ to $91_{20}$ and $91_{21}$ to $91_{40}$ intended to receive sleeves $11c_1$ to $11c_{20}$ and $11c_{21}$ to $11c_{40}$ of holder 1c from underneath and pins $20c_1$ to $20c_{20}$ and $20c_{21}$ to $20c_{40}$ of package 2c from above. As shown in detail in FIG. 12, each sleeve, such as sleeve $11c_2$, is made up of two electrically conductive vertical reeds, in this case parallel to sidewalls 121 and 122, having a length less than that of holes $91_1$ to $91_{40}$. When cover 9 and holder 1c are assembled by pushing cover 9 downwards, lower ribs $982_1$ and $982_2$ of lugs $98_1$ and $98_2$ penetrate firstly into apertures $131_1$ and $131_2$ respectively, and the reeds of sleeves $11_1$ to $11_{40}$, with a slight interference fit, enter chamfered holes $91_1$ to $91_{40}$. Outer longitudinal edges of side-members $92_1$ and $92_2$ are vertical and slide between side walls 121 and 122. Package 2c then slips over cover 9 such that pins $20c_1$ to $20c_{40}$ vertically enter from the upper chamfered openings into holes $91_1$ to $91_4$ and slide in between the reeds of sleeves $11c_1$ to $11c_{40}$ respectively. Package 2c is then sharply pressed downwards such that upper ribs $981_1$ and $981_2$ engage in apertures $131_1$ and $131_2$, and lower ribs $982_1$ and $982_2$ drop below cross-members $13c_1$ and $13c_2$. At this stage, the convexity of cover cross-members $91_1$ to $93_4$ decreases and cross-members $93_1$ to $93_4$ tend to flatten out whereby side-members $92_1$ and $92_2$ move further apart and come into pressure contact with sidewalls 121 and 122 running around the holder. As side-members $92_1$ and $92_2$ become pushed apart, and reeds of sleeves $11c_{11}$ to $11c_{40}$ are substantially pressed outwards thereby fixedly pinching the tips of pins $20c_1$ to $20c_{40}$ such that effective mechanical and electrical contacts therewith are made, without relying on soldering. Furthermore, cover 9 and package 2c are fixedly held superposed on holder 1c.

When package 2c is withdrawn, a special forked tool, or more simply a screw-driver, can be used to free lower ribs $98 2_1$ and $98 2_2$ upwards from underneath end cross-members $13c_1$ and $13c_2$ whereupon lower ribs then become engaged in apertures $131_1$ and $132_2$. The upward movement of lugs $98_1$ and $98_2$ is eased by the natural resilience of cover cross-members $93_1$ and $93_4$ that become more convex in shape, and the natural resilience of holder sidewalls $12_1$ and $12_2$ that become more vertical. Package 2c can be removed without necessarily removing the cells since cover 9 is still locked to holder 1c by means of lower ribs $982_1$ and $982_2$ in apertures $131_1$ and $131_2$. The withdrawal of one or several cells is achieved by pulling cover 9 upwards so as to free lower ribs $982_1$ and $982_2$ from apertures $131_1$ and $131_2$.

Figure 13:
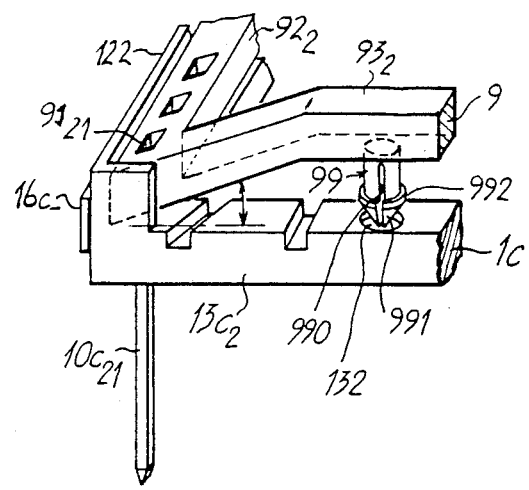
FIG. 13 is a view in perspective of second cover and holder locking means for the embodiment in FIG. 10.

In a further embodiment of means for locking cover 9 to holder 1c, lugs $98_1$ and $98_2$ and the groove and aperture arrangements $130_1$–$131_1$ and $130_2$–$131_2$ are replaced by two vertical cylindrical lugs 99 subjacent to cross-members $93_1$ and $93_2$, and by two vertical cylindrical holes 132 in the middle of cross-members $13c_1$ and $13c_2$, as shown in FIG. 13. Each lug 99 carries a diametral vertical slit 990 that is perpendicular to cross-member $93_1$, $93_2$ and a downwardly converging conical end tip 999 having top-side flange 992. As shown in FIGS. 14A to 14E, a locking ring 133 is added to an upper end of each hole 132 and fixed therein. Ring 133 comprises an inner annular groove 134 having a conical lower portion. Hole 132 can be blind or open out at 135 with a diameter smaller than most of the remaining hole such that a cylindrical chamber 136 is created beneath ring 133. Provided in chamber 136 is a washer 137 having a chamfered upper portion. The diameters of bores in the ring 133 and washer 137 are smaller than the diameter of tip 991 and substantially equal to the width of the tip when lug arms separated by slit 990 are pressed against each another, as depicted in FIGS. 14A and 14C. In other embodiment, the cross-section of members 99, 133 and 137 and bores therein are square or polygonal.

When the time comes to lock cover 9 on holder 1c, once cells $4_1$ to $4_3$ have been inserted in slots $14c_1$ to $14c_3$ and prior to placing package 2c onto cover 9, flanges 992 of two lugs 99 are engaged in inner annular grooves 134 of rings 133 as shown in FIG. 14E. After insertion of pins $20c_1$ to $20c_{40}$ in sleeves $11c_1$ to $11c_{40}$, a second downward pressure brings the arms of tips 991 together by a downward movement into the bores in rings 133, as shown in FIG. 14A. Then flanges 992 spread out beneath rings 133, as shown in FIG. 14B. At this stage, the pins of package 2 are locked in the sleeves of holder 1c.

A third downward pressure on package 2c has the result that tips 991 become engaged in washers 137, as shown in FIG. 14C. The opposed deflections of the arms on either side of slit 990 of each lug 99 enable respective flange 932 to make lug 99 momentarily integral with respective washer 137. Once package 2c has been released, the elastic expansion of cross-members $93_1$ to $93_4$ of the cover lifts lugs 99 upwards bringing washers 137 with them through their sliding action in chambers 136 until the washers butt against rings 133, as shown in FIG. 14D. Washers 137 fall back to the bottom of chamber 136 and tips 931 then move up inside rings 133 until flanges 992 enter inner annular grooves 134 when slits 990 expand, as shown in FIG. 14E. Package 2 can then be withdrawn from cover 9.

Again referring to FIG. 10, cover 9 comprises two resilient and electrically conductive contact reeds $95_+$ and $95_-$, and a clamping diode $D_1$. Reeds $95_+$ and $95_-$ longitudinally extend away from the mid-points of cross-members $93_1$ and $93_2$ into slots $94_1$ and $94_2$ where they come into pressure contact with positive terminal $40_1{}^+$ of cell $4_1$ and negative terminal $40_2{}^-$ of cell $4_2$ respectively, as shown in FIG. 11F.

The diode $D_1$ is fully embedded in cross-member $93_1$ between hole $91_1$, and reed $95_+$. An electrical conductor is partly embedded in cross-member $93_1$, connects reed $95_+$ to an anode of diode $D_1$, and offers a bend $91_T$ emerging outwardly from the middle of cross-member $93_1$, as shown in FIGS. 10 and 15. Bend $91_T$ serves as a test terminal, like pin $10_T$ in FIG. 1.

Figure 16:
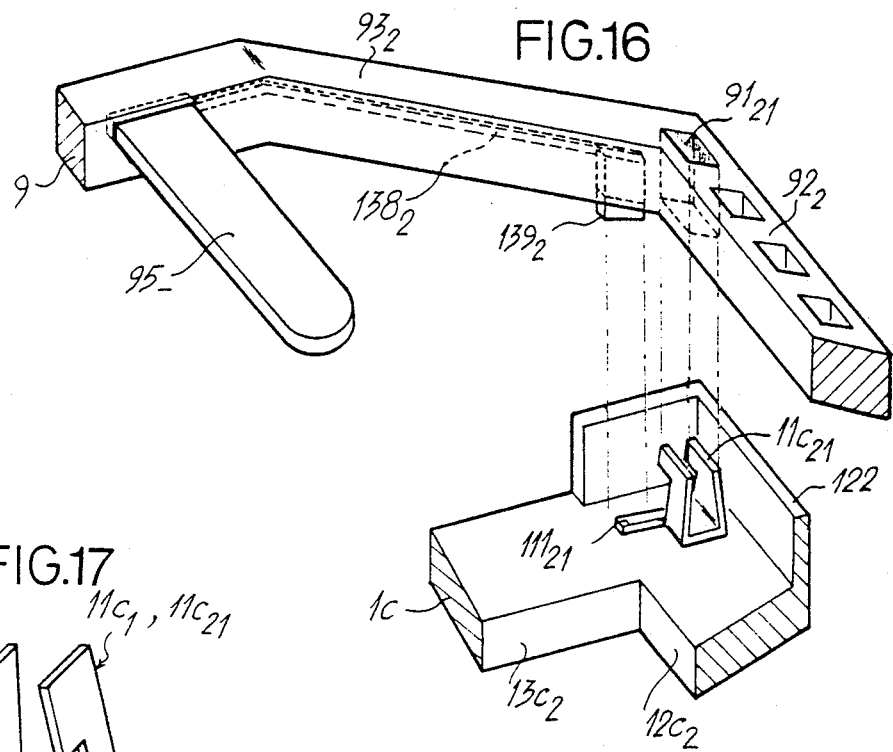
FIG. 16 is a schematic exploded view in perspective of an electrical connection between another contact reed relative to another cell and a negative supply pin of the holder as in FIG. 10.
Figure 17:
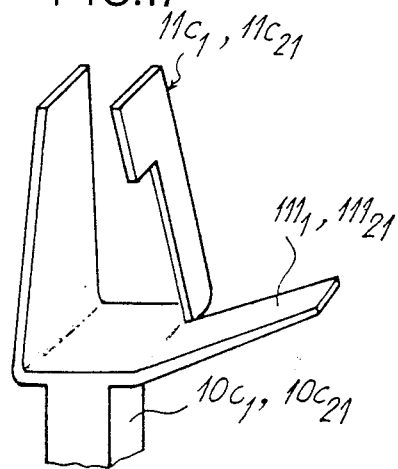
FIG. 17 is a view in perspective of a specific sleeve of a supply pin of the holder as in FIG. 10.

A cathode of diode $D_1$ is connected to an electrical conductor $138_1$ embedded in cross-member $93_1$. Conductor has a downwardly vertically extending flat tip $139_1$ emerging from the underside of cross-member $93_1$ in the vicinity of hole $91_1$, as shown in FIGS. 10 and 15. Likewise, contact reed $95_-$ is connected to an electrical conductor $138_2$ embedded in cross-member $93_2$ and having a downwardly vertically extending flat tip $139_2$ emerging from the underside of cross-member $93_2$ close to hole $91_{21}$, as shown in FIG. 16. Tip-ends $139_1$ and $139_2$ are intended respectively to come into mechanical and electrical contact with contact plates $111_1$ and $111_2$ on sleeves $11c_1$ and $11c_2$ of supply pins $10c_1$ and $10c_{21}$, as shown in FIG. 12. As can be seen in FIG. 17, contact plate $111_1$, $111_2$ is cut out in one of the two reeds of sleeve $11c_1$, $11c_2$ just above supply pin $10c_1$, $10c_{21}$ and is substantially deflected upwards. When cover 9 is inserted over holder 1c between surrounding walls 121 and 122, tip-ends $139_1$ and $139_2$ press on contact plates $111_1$ and $111_2$ respectively, and simultaneously therewith, contact reeds $95_+$ and $95_-$ press on terminal $40_1{}^+$ of cell $4_1$ and on terminal $40_2{}^-$ of cell 42 respectively. Terminal $40_1{}^+$ of cell $4_1$ is connected to positive supply pin $10c_1$ through test terminal $91_T$, diode $D_1$, conductor $138_1$, tip-end $139_1$ of conductor $138_1$ and contact plate $111_1$ of sleeve $11c_1$. Terminal $40_2{}^-$ of cell $4_2$ is connected to negative supply pin $10c_{21}$ through conductor $138_2$, tip-end $139_2$ of conductor $138_2$ and contact plate $111_{21}$ of sleeve $11c_{21}$.

The structure of holder 1c such as described above can be adapted to the shape, the mutual configuration of the terminals on each cell and the dimensions, such as the thickness, of the cells. Various adaptations are given as examples in FIGS. 11A to 11H. In FIG. 11E, holder 1c contains three button cells each equipped with a small circlar metallic surface as a positive terminal, analogous with negative terminals $40_1{}^-$ to $40_3{}^-$ of cells $4_1$ to $4_3$, and a large cylindrical metallic surfaces as a negative terminal, analogous with positive terminals $40_1{}^+$ to $40_3{}^+$ of cells $4_1$ to $4_3$; in this case, cap 56 acting as a switch receives the negative terminal of a cell inserted in slot $14c_1$, and connecting plates $5c_1$ and $5c_2$ are turned around through 180°; grooves 59S and 59H are also provided in cross-member $13c_1$ to receive lever 59, as indicated in FIG. 10. FIGS. 11G and 11H respectively correspond to FIGS. 11E and 11F wherein each cell is replaced by two button cells half the thickness of the cells in FIGS. 11E and 11F; in this case, right-angle connecting plates $5c_2$, as in FIG. 11E, and $5c_1$, as in FIG. 11F, are respectively replaced by connecting plates $5c'_2$ and $5c'_1$ each having a vertical portion running through corresponding intermediate cross-member $13c_4$ and $13c_3$, and each having a horizontal short upper portion and a horizontal long lower portion at respective ends of the vertical portion to be pressed into contact on the bottom and top of the terminals on the upper and lower slim-line cells in adjacent slots $14c_2$ and $14c_3$, $14c_1$ and $14c_3$, respectively. Lastly, holders are shown in FIGS. 11A to 11D with just two slots $14c_1$ and $14c_2$ each housing one or two cells arranged respectively in a fashion analogous to the end cells in FIGS. 11E to 11H.

The structures of holder $1c$ and cover 9 can be substantially modified. Each of slots $14c_1$ to $14c_3$ and $94_1$ to $94_3$ can carry a longitudinally or transversely extending bar or can include a downwardly molded bottom in order to create cavities for the cells. The spare power source switch can consist of a longitudinal or vertical slide with metallized ends in lieu of cap 56.

A description now follows of another embodiment mode of an integrated circuit package holder containing, over and above a spare power source with two slim-line cells $4_1$ and $4_2$, a circuit 7 for monitoring the charge in the spare source with a view to indicating any discharge in the spare source with respect to a predetermined voltage threshold.

Figure 18:
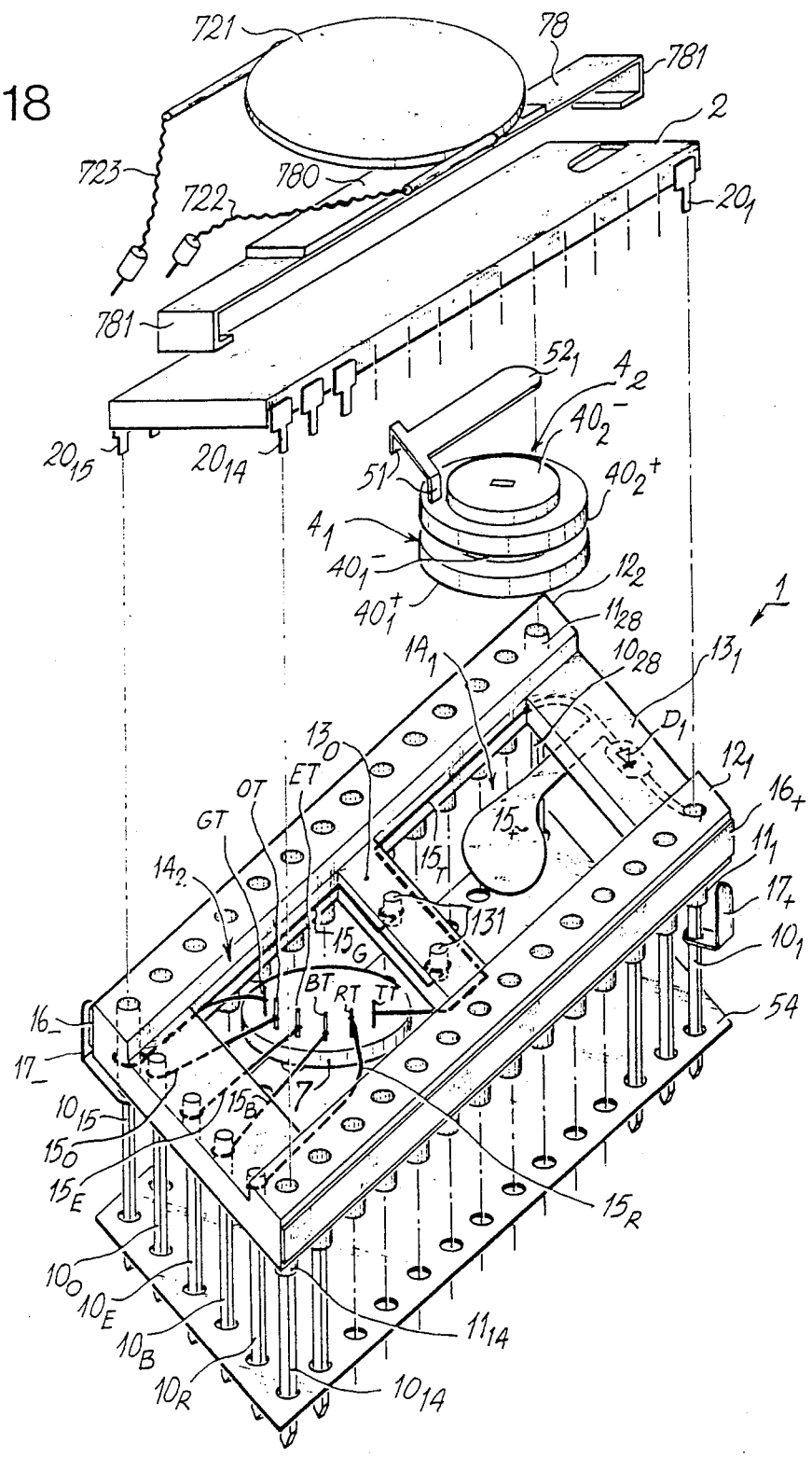
FIG. 18 is an exploded view in perspective of another integrated circuit package holder embodying the invention, having two spare button cells superposed parallel to major sides of an integrated circuit package, as well as a package containing a spare cell voltage monitoring circuit and/or a function inhibiting circuit.

A first embodiment of holder 1 in accordance with this other embodiment mode is illustrated in FIG. 18. Holder 1 is shaped in a generally similar fashion to the holder already described in reference to FIG. 1, although in another embodiment, the holder can be analogous to holder $1c$ shown in FIG. 10.

Two button cells $4_1$ and $4_2$ are horizontally laid one above the other in first slot $14_1$, positive terminal $40_2{}^+$ of cell $4_2$ being placed over negative terminal $40_1{}^-$ of cell $4_1$. Positive terminal $40_1{}^-$ of lower cell $4_1$ is connected to supply pin $10_1$ of the holder via pan-shaped conductive contact reed $15_{30}$ and diode $D_1$. Test pin $10_T$ is done away with. Terminal $40_1{}^+$ is also connected via an electrical conductor $15_T$ to a test terminal TT of monitoring circuit 7 that is lodged in second slot $14_2$. Conductor $15_T$ is preferably embedded in the holder and runs around slot $14_1$ through cross-member $13_1$, side-member $12_2$ and central cross-member $13_0$.

Connecting plate 5 in FIG. 1 is replaced by an analogous connecting plate comprising only the longitudinal half-portion between contact end $52_1$ and the two downwardly extending lugs 51. Horizontal end $52_1$ is pressed against negative terminal $40_2{}^-$ of upper cell $4_2$ and pushes cells $4_1$ and $4_2$ against contact reed $15_+$ when both lugs 51 are plugged in holes 131 of central cross-member $13_0$. Holes 131 are metallized in this case. Holes 131 are connected to the ground referred negative supply pin $10_{15}$ of holder 1 and to a grounding terminal GT of monitoring circuit 7 via an electrical conductor $15_G$ preferably embedded in the holder and running around slot $14_2$ through cross-member $13_0$ and side-member $12_2$.

With the exception of the modifications to the holder regarding the insertion of monitoring circuit 7, all the other holder members such as pins $10_1$ to $10_{28}$, sleeve $11_1$ to $11_{28}$, conductive strips $16_+$ and $16_-$, conductive right-angled spades $17_+$ and $17_-$ and electrically insulating sheet 54 in FIG. 18 are analogous to those described in reference to FIG. 1, respectively.

Figure 19:
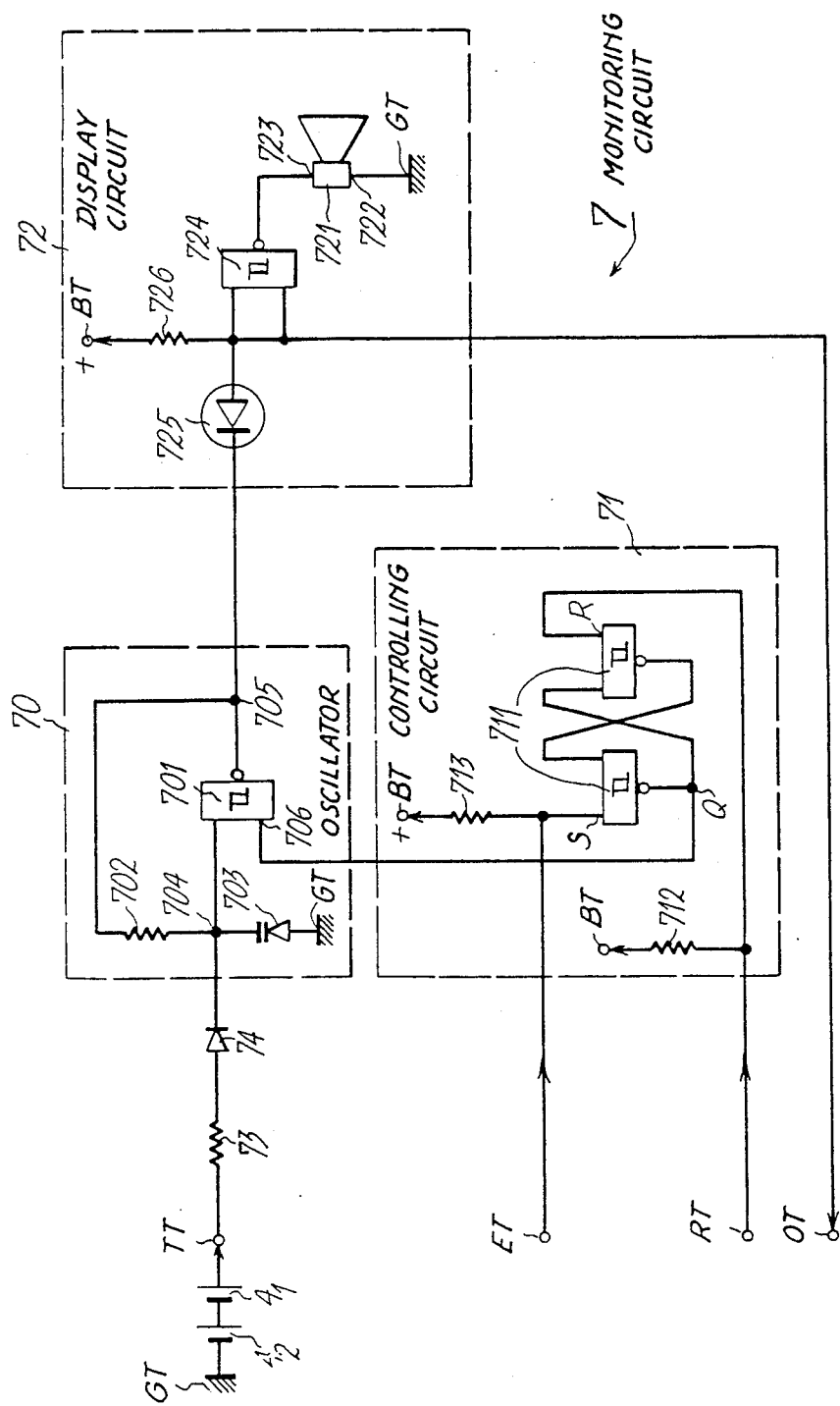
FIG. 19 is a block diagram of the monitoring circuit.

The block diagram of monitoring circuit 7 is shown in FIG. 19. Circuit 7 essentially comprises a voltage controlled oscillator tuned to a variable frequency within an audible frequency range, a controlling circuit 71 controlling oscillator 70, and a display circuit 72.

Oscillator 70 comprises a trigger 701 associated with a feedback resistor 702 and a variable capacitor in the form of a varicap 703 connected to terminal GT. An input of the oscillator consists of a terminal 704 common to resistor 702 and to varicap 703. Terminal 704 is connected to test terminal TT and hence to positive terminal $40_1{}^+$ of spare source $4_1$–$4_2$ through a resistor 73 connected in series with a forward biased diode 74. The signal frequency appearing at an output 705 from trigger 701 is inversely proportioned to the RC parameter of the constant resistance of resistor 702 and the variable capacitance of varicap 703, and is therefore inversely proportional to the voltage applied to test terminal TT.

Controlling circuit 71 consists essentially of an RS type flip-flop 711. An input R of flip-flop 711 is connected to a zero resetting terminal RT of circuit 7. Another input S of flip-flop 711 is connected to an enabling terminal ET of circuit 7. One output Q of flip-flop 711 is connected to a triggering input 706 of trigger 701. Terminals ET and RT as well as an output terminal OT of circuit 7 are connected to a microprocessor (not shown) mounted on printed circuit board 3 via respective electrical conductors $15_E$, $15_R$ and $15_O$ embedded in holder 1 at second slot $14_2$ and via respective additional pins $10_E$, $10_R$ and $10_O$, as shown in FIG. 18. The microprocessor or another equivalent circuit makes it possible to question the monitoring circuit to indicate discharge of the spare source. This inquiry is carried out when the microprocessor does not perform other priority tasks, or periodically depending on the organization of the other electronic circuits mounted on the printed circuits board.

The microprocessor inquiry is transmitted in the form of a transient negative pulse to terminal RT in order to reset flip-flop 711. More periodically, a transient negative pulse is fed to terminal ET by the microprocessor in order to enable trigger 701 by feeding a logic state "1" to input 706. If the spare source voltage on terminal TT is higher than the predetermined threshold voltage, typically equal to 2.5 volts for two cells each working normally with 1.5 volt, oscillator 70 stays off and no oscillating signal is detected by the microprocessor at the output OT. On the other hand, if the voltage on the test terminal TT is lower than the predetermined threshold, which would correspond to discharge in the two spare source cells, an audible frequency oscillating signal is delivered by terminal 705 of oscillator 70 to the terminal OT and energizes display circuit 72. A warning is given by circuit 72 to the effect that the spare source will soon be inoperative, where the predetermined voltage threshold is chosen substantially higher than the spare source minimum withstand voltage. The state of the terminal RT is not modified by the microprocessor in response to the oscillating signal. In the opposite case, the microprocessor delivers a transient pulse on the terminal RT to zero reset flip-flop 711 that cuts out oscillator 70, thereby avoiding any un-timely discharge from spare source $4_1$–$4_2$.

Display circuit 72 comprises an electro-acoustic transducer 721 such as a miniature loudspeaker in the form of a piezoelectric bar buzzer. Terminals 722 and 723 of transducer 721 are connected to the grounding terminal GT and, via an inverter 724, and to terminals 705 and OT respectively. Circuit 70 can, on option, carry a display device 725 such as a liquid crystal or LED block. The display device is then connected between the output 705 of oscillator 70 and the terminal OT connected to inputs of inverter 724.

Monitoring circuit 7 also comprises other components, such as bias resistors 712, 713 and 726 respectively connected to the terminals RT, ET and OT and raised to a positive potential by a common terminal BT. The terminal BT is connected to board 3 via an electrical conductor $15_B$ embedded in holder 1, as depicted in FIG. 18.

Figure 20:
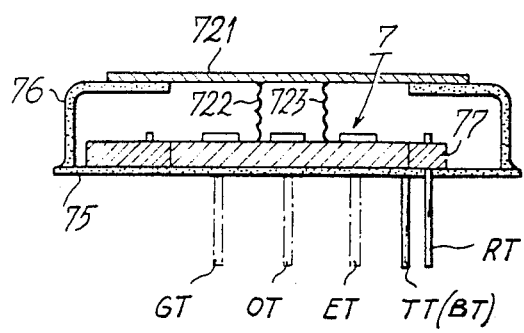
FIGS. 20, 21, 22 are schematic views in cross-section, from above and longitudinally of a package containing the monitoring circuit, respectively.
Figure 21:
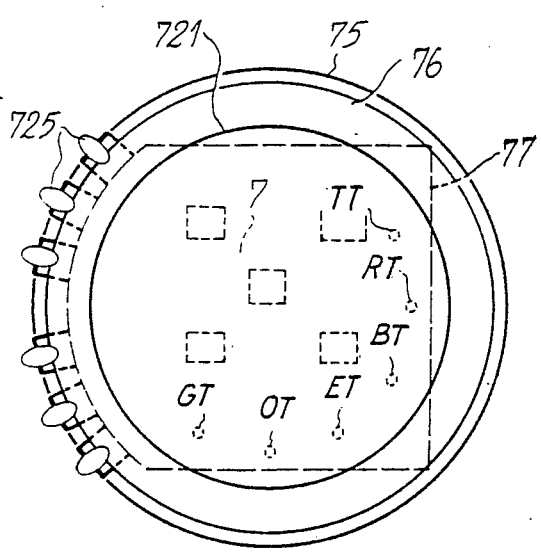
Figure 22:
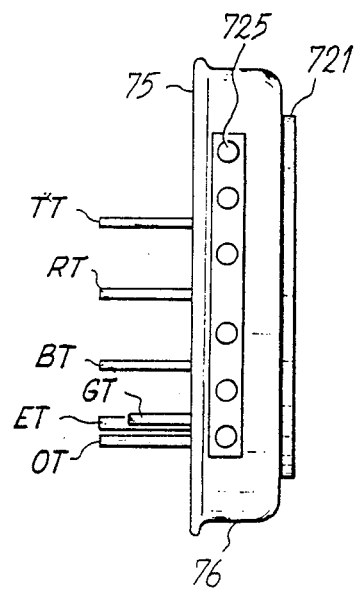

Monitoring circuit 7 can be manufactured in the form of an integrated circuit enclosed in a package or in a hybrid form of discrete components mounted on a small printed circuit board. FIGS. 20, 21 and 22 illustrate an embodiment of the monitoring circuit 7 package composed of an electrically insulating discord base member 75 and a cylindrical metal or plastic cap 76. A substrate 77 for integrated or discrete monitoring circuit 7 is bonded to an inside surface of base member 75. Six small vertical conductive prongs constitute the terminals GT, OT, ET, BT, RT and TT and are plugged into respective metallized holes in a moulded bottom of slot $14_2$ in holder 1. Slot $14_2$ forms here a circular receptacle of package 75-76 having a typical diameter of 2.5 cm. The aforesaid metallized holes from the ends of conductors $15_G$, $15_O$, $15_E$, $15_B$, $15_R$ and $15_T$. In another embodiment, the prongs of package 75-76 related to the terminals OT, ET, BT and RT replace pins $10_O$, $10_E$, $10_B$ and $10_R$ and pass through the bottom of cavity $14_2$. Holes are provided in part of the circular circumference of cap 76 for the display device 725, such as light emitting diodes shown in FIGS. 21 and 22.

Piezoelectric buzzer 721 can form a major portion of the top of cap 76 and carry terminals 722 and 723 in the form of wires lodged in the monitoring circuit package and soldered to substrate 77, as shown in FIGS. 20 and 21. In a further embodiment shown in FIG. 18, buzzer 721 containing inverter 724 is laid flat on an adhesive strip 780 that is integral with a U-shaped clip 78. Downwardly folded tabs 781 on clip 78 are snapped over the lateral ends of integrated circuit package 2. Terminals 722 and 723 of buzzer 721 are made up of flexible wires soldered or pinched onto pins $10_{15}$ and $10_0$ of holder 1.

Figure 23:
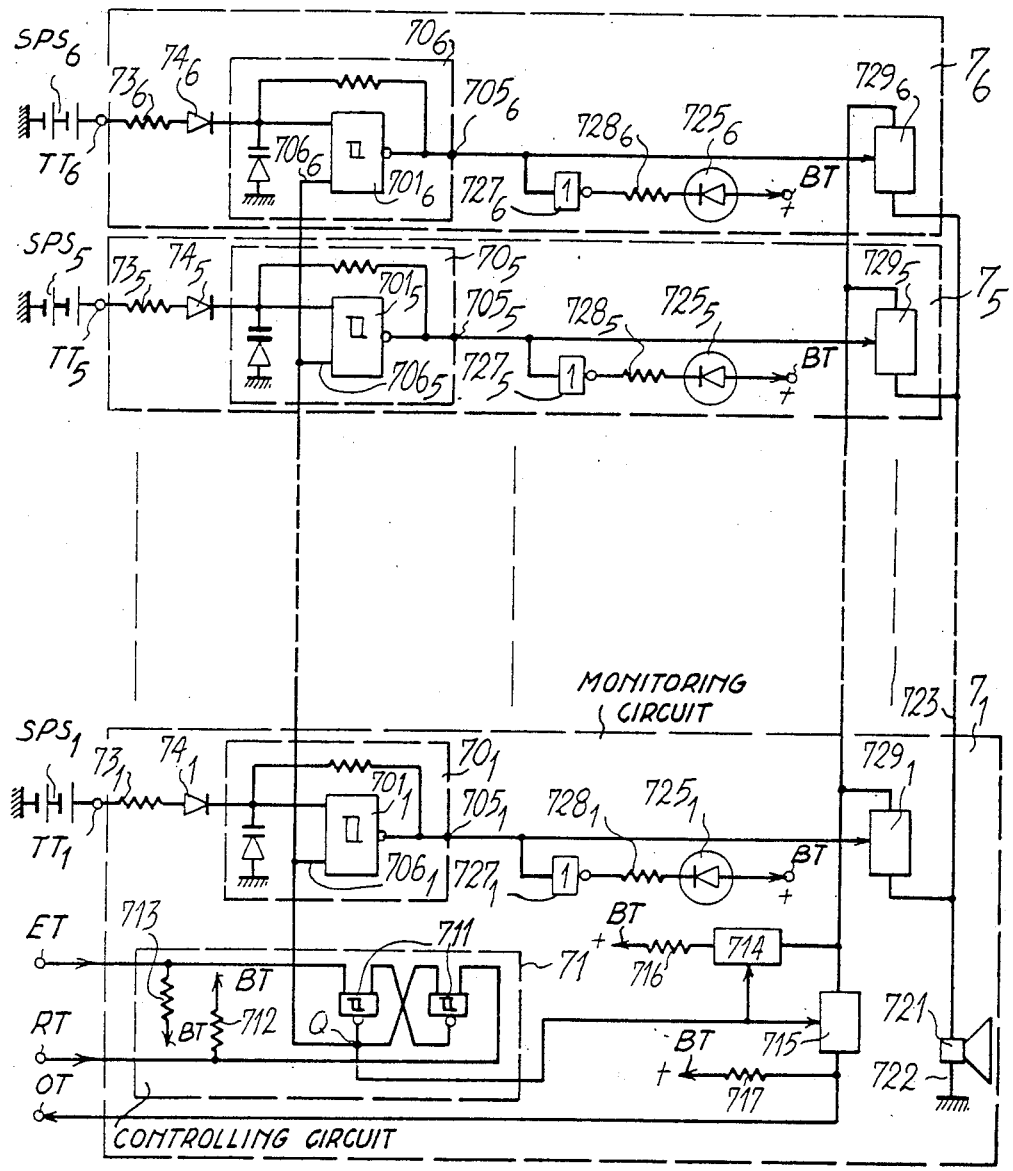
FIG. 23 is a block diagram of a monitoring circuit common to six holders embodying the invention.
Figure 24:
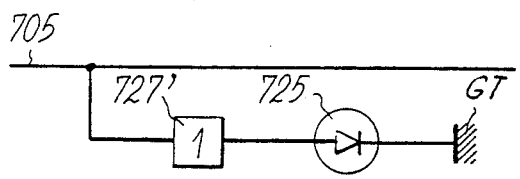
FIG. 24 depicts another embodiment of connection of a display device in the monitoring circuit in FIG. 23.

In a further embodiment depicted in FIG. 23, a common controlling circuit 71 monitors a greater number of spare power sources, e.g. six $SPS_1$ to $SPS_6$. Each power source $SPS_1$ to $SPS_6$ is lodged in first slot $14_1$ of a respective integrated circuit package holder $1_1$ to $1_6$ analogous with holder 1 shown in FIG. 18. Second slot $14_2$ in each of holders is in the form of a cavity including a hybrid or integrated monitoring circuit $7_1$ to $7_6$ comprising an oscillator $70_1$ to $70_6$, a resistor $73_1$ to $73_6$ and a diode $74_1$ to $74_6$ all analogous with those described with reference to FIG. 19, respectively, as well as other components $727_1$, $727_6$, $728_1$ to $728_6$ and $729_1$ to $729_6$. The hybrid or integrated circuit further comprises a display device $725_1$ to $725_6$, such as light emitting diodes or a liquid crystal block, interconnected between the positive terminal BT and output $705_1$ to $705_6$ from oscillator $70_1$ to $70_6$ through an inverter $727_1$ to $727_6$ and a resistor $728_1$ to $728_6$. A non-inverting component $727'_1$ to $727'_6$ and the display device $725_1$ to $725_6$ can be suitably series-connected to the grounding terminal GT as in another embodiment shown in FIG. 24.

One of the holders $1_1$ to $1_6$, such as the holder $1_1$ related to circuit $7_1$ shown in FIG. 15, further includes controlling circuit 71 with RS flip-flop 711, piezoelectric buzzer 721, two switches 714 and 715 and two bias resistors 716 and 717. Output Q of flip-flop 711 is connected to triggering inputs $706_1$ to $706_6$ of oscillators $70_1$ to $70_6$. Terminal 723 of common buzzer 721 is connected to outputs $705_1$ to $705_6$ of oscillators $70_1$ to $70_4$ via switches $729_1$ to $729_6$. Switches $729_1$ to $729_6$, 714 and 715 are CMOS-technology gates. The various connections between the six circuits $7_1$ to $7_6$ carried by the holders $1_1$ to $1_6$ are made via holder pins and conductive strips on printed circuit board 3.

The monitoring circuit shown in FIG. 23 operates in the following manner. A transient negative pulse fed to the terminal RT resets flip-flop 711 which closes gates 714 and 715. An enabling pulse fed to the terminal ET then changes the state of flip-flop 711 that enables triggers $701_1$ to $701_6$ of oscillators $70_1$ to $70_6$ and opens gates 714 and 715. As a second input on gate 714 is connected to the positive voltage terminal BT across resistor 716, an output of gate 714 applies a positive voltage to the inputs of gates $729_1$ to $729_6$ and to another input of gate 715. Other inputs of gates $729_1$ to $729_6$ are respectively connected to output $705_1$ to $705_6$ of oscillators $70_1$ to $70_6$. If none of the spare power source $SPS_1$ to $SPS_6$ produces a voltage lower than the predetermined voltage threshold, gates $729_1$ to $729_6$ and 715 stay off and the voltage on the output terminal OT goes unchanged.

Should any of the spare power sources $SPS_1$ to $SPS_6$ deliver a voltage lower than the predetermined voltage threshold, signifying then that the source is being discharged, an audible frequency signal is delivered from respective output $705_1$ to $705_6$ of the corresponding oscillator $70_1$ to $70_6$. The audible frequency signal energizes the corresponding display device $725_1$ to $725_6$ and, in synchronism with the audible frequency, opens the corresponding gate $729_1$ to $729_6$. The positive voltage fed by gate 714 activates buzzer 721 via the corresponding gate $729_1$ to $729_6$. In view of the buzzer 721 impedance, the output OT of gate 715 delivers ground referred voltages in synchronism with the audible frequency. The alternating signal on the output OT is then processed by the microprocessor and indicates a voltage abnormality of one of the six spare power sources $SPS_1$ to $SPS_6$.

In a further embodiment, a monitoring circuit comprises all the circuits $7_1$ to $7_6$ in FIG. 23 and is fully carried on the same holder, such as the holder related to circuit $7_1$, which comprises then five test pins connected via the printed circuit board to the positive terminals of the power sources $SPS_2$ to $SPS_6$ included in the other five holders.

In a further embodiment, the integrated or hybrid ciruit package 75-76 in cavity $14_2$ of holder 1 shown in FIGS. 18 and 20 to 22 also includes an inhibiting circuit 8. Circuit 8 inhibits a predetermined function of the integrated circuit housed in package 2 when the voltage of the main power source MPS disappears. If the integrated circuit in package 2 is a memory, the predetermined function to inhibit is a writing authorization in the memory, for example.

Figure 25:
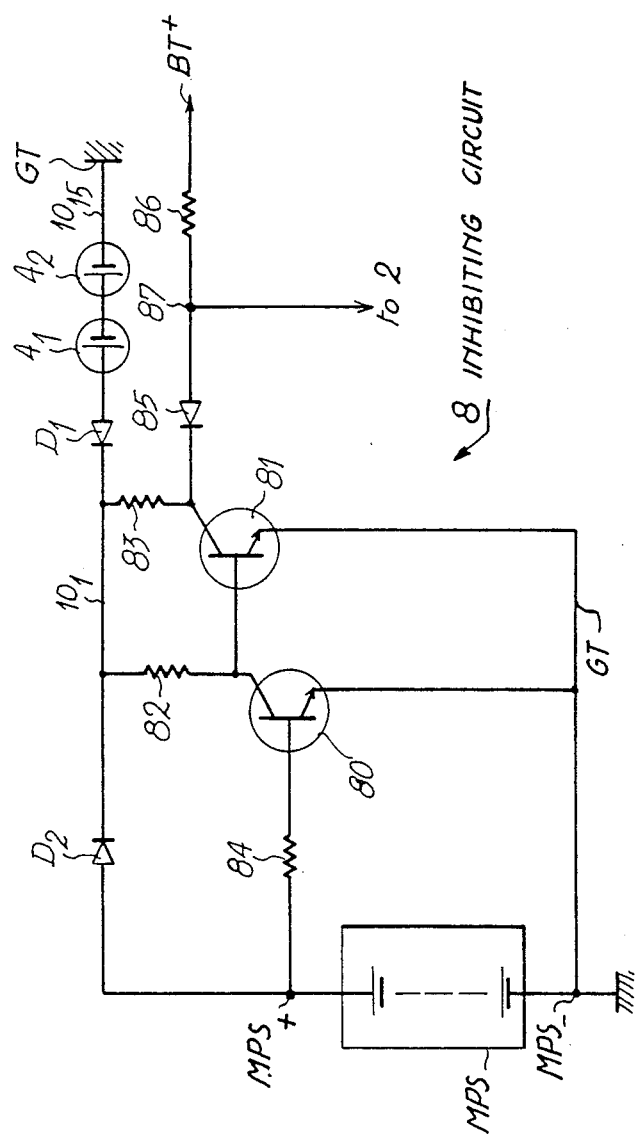
FIG. 25 is a block diagram of the function inhibiting circuit.

As shown in FIG. 25, inhibiting circuit 8 comprises two npn transistors 80 and 81 having emitters connected to the grounding terminal GT. Collectors of transistors 80 and 81 are respectively connected across resistors 82 and 83 to a common terminal of clamping diodes $D_1$ and $D_2$ already mentioned with reference to FIG. 3. The collector of transistor 80 is connected to a base of transistor 81. A base of transistor 80 is connected to the positive voltage terminal MPS+ of the main power source MPS to be monitored, via a resistor 84 and an additional pin (not shown) of holder 1. The collector of transistor 81 is connected to the terminal BT across a diode 85 and a resitor 86. An anode of diode 85 and a terminal of resistor 86 form a common terminal 86 to be connected to a function inhibiting input of the integrated circuit in package 2, across an additional pin (not shown) of holder 1.

When the main power source MPS delivers a voltage normally, the positive voltage of terminal MPS+ turns on first transistor 80 and turns off second transistor 81. The voltage on the collector of transistor 81 is positive, which produces no active ground to terminal 87.

When the main power source voltage disappears, spare source $4_1$–$4_2$ takes over from the main source MPS by applying a supply voltage across diode $D_1$. On the other hand, the disappearance of the positive voltage on the terminal MPS+ turns off transistor 80. The positive voltage on the collector of transistor 80 turns on second transistor 81, and diode 85 becomes conductive. An active ground is thus present at terminal 87 that controls inhibition of the predetermined function in the integrated circuit of package 2.

What I claim is:

1. Apparatus for holding a plurality of integrated circuit packages (2) having conductive pins (20) connected therewith, comprising
  (a) a plurality of integrated circuit package holders (1) for holding the packages, respectively, each of said holders containing a recess (14);
  (b) a plurality of conductor pins (10) arranged beneath each of said holders, said integrated circuit package conductor pins being connected with said conductor pins of a corresponding holder, respectively, by a plug connection, two predetermined pins of said conductor pins of each holder being connected with two supply pins of the corresponding integrated circuit package;
  (c) two conductive strips (16) being connected with two parallel edges of each of said holders;
  (d) two connecting conductive members (17) associated with each of said holders, respectively, each of said conductive members including a first end secured to one of said two predetermined conductor pins, respectively, and a second end secured to one of said conductive strips, respectively;
  (e) a removable spare power source (4) arranged in the recess of one of said holders connected between said two predetermined conductor pins; and
  (f) conductive straps (ST) for electrically connecting said conductive strips of said one holder with said conductive strips of said other holders.

2. Apparatus for holding an integrated circuit package (2) having conductive pins (20) connected therewith, comprising
  (a) a holder (1) for holding the integrated circuit package, said holder containing a recess (14);
  (b) a plurality of conductor pins (10) arranged beneath said holder and being connected with the pins of the integrated circuit package via a plug connection; two predetermined pins of said holder conductor pins being connected with two supply pins of the integrated circuit package;
  (c) a removable spare power source (4) arranged within said holder recess and including terminals connected between said two predetermined conductor pins; and
  (d) monitoring means (7) for detecting a voltage lower than a predetermined source discharge threshold across said source terminals, said monitoring means including
    (1) an oscillator (70) controlled by the voltage across said source terminals for producing an output signal corresponding with said voltage; and
    (2) display means (72) activated by said output signal from said oscillator in response to a voltage across said source terminals lower than said predetermined threshold.

3. Apparatus as defined in claim 2 wherein said oscillator output signal has an audible frequency.

4. Apparatus as defined in claim 2, wherein said oscillator output signal has a frequency inversely proportional to the voltage across said source terminals.

5. Apparatus as defined in claim 2, wherein said display means comprises light emitting diodes.

6. Apparatus as defined in claim 2, wherein said display means comprises a liquid crystal block.

7. Apparatus as defined in claim 2, wherein said display means comprises an electroacoustic transducer.

8. Apparatus as defined in claim 7, wherein said electroacoustic transducer is secured to the integrated circuit package.

9. Apparatus as claimed in claim 2, wherein said display means comprises a miniature piezoelectric buzzer.

10. Apparatus as defined in claim 2, and further comprising means 71 for periodically triggering said oscillator.

11. Apparatus for holding an integrated circuit package (2) having conductive pins (20) connected therewith, comprising
  (a) a holder (1) for holding the integrated circuit package, said holder containing a recess (14);
  (b) a plurality of conductor pins (10) arranged beneath said holder and being connected with the pins of the integrated circuit package via a plug connection; two predetermined pins of said holder conductor pins being connected with two supply pins of the integrated circuit package;
  (c) a removable spare power source (4) arranged within said holder recess and including terminals connected between said two predetermined conductor pins; and
  (d) means (8) for inhibiting a predetermined function in the integrated circuit when a main supply voltage is removed from the two supply pins.

12. Apparatus as defined in claim 11, wherein said inhibiting means includes
  (1) a first transistor (80) having a base connected with a positive terminal of the main power source; and
  (2) a second transistor (81) having a base connected to a collector of said first transistor and having a collector connected to an inhibiting terminal of the integrated circuit, the collectors of said first and second transistors also being connected to the positive terminals of said main and spare power sources.

13. Apparatus for holding an integrated circuit package (2) having conductive pins (20) connected therewith, comprising
  (a) a holder (1) for holding the integrated circuit package, said holder containing a recess (14);

(b) a plurality of conductor pins (10) arranged beneath said holder and being connected with the pins of the integrated circuit package via a plug connection; two predetermined pins of said holder conductor pins being connected with two supply pins of the integrated circuit package;

(c) a removable spare source (4) arranged within said holder recess and including terminals connected between said two predetermined conductor pins; and (d) monitoring means (7) for detecting a voltage lower than a predetermined source discharge threshold across said source terminals; and (e) means (8) for inhibiting a predetermined function in the integrated circuit when a main supply voltage is removed from the two supply pins.

14. Apparatus for holding an integrated circuit package (2) having conductive pins (20) connected therewith, comprising (a) a holder (1) for holding the integrated circuit package, said holder containing a recess (14);

(b) a plurality of conductive pins (10) arranged beneath said holder;

(c) contact means (11) overlying said holder for connecting the package pins with said holder pins, two predetermined pins of said holder pins being connected with two supply pins of the integrated circuit package;

(d) a removable spare power source (4) arranged within said holder recess and including terminals connected between said two predetermined holder pins;

(e) a cover (9) removably connected with said holder between said holder and the package, said cover containing a plurality of openings for receiving said contact means, respectively; and (f) means (8) for inhibiting a predetermined function in the integrated circuit when a main supply voltage is removed from the two supply pins.

15. Apparatus for holding an integrated circuit package (2) having conductive pins (20) connected therewith, comprising (a) a holder (1) for holding the integrated circuit package, said holder containing a pair of recesses (14);

(b) a plurality of conductor pins (10) arranged beneath said holder and being connected with the pins of the integrated circuit package via a plug connection; two predetermined pins of said holder conductor pins being connected with two supply pins of the integrated circuit package;

(c) a pair of removable spare power sources arranged within said recesses, respectively, and connected in series between said two predetermined holder pins;

(d) a pair of first conductive members having first ends embedded in said holder and connected to said predetermined holder pins, respectively, and having second ends protruding into said two recesses, respectively, for connection with first opposite polarity terminals of said sources, (e) a third conductive member partially embedded within said holder between said two recesses, said third conductive member having ends located in the bottom portion of said recesses, respectively, for receiving in pressure contact second opposite polarity terminals of said sources;

(f) a pair of sealing covers closing said recesses by locking means and pressing said source against said third conductive member ends, respectively; and (g) two flat conductive members secured beneath said covers in pressure contact with second opposite polarity terminals of said sources, said flat conductive members having tabs in pressure contact with said second protruding ends of said first conductive members inside said recesses, respectively.

16. Apparatus for holding an integrated circuit package (2) having conductive pins (20) connected therewith, comprising (a) a holder (1) for holding the integrated circuit package, said holder containing a recess (14);

(b) a plurality of conductor pins (10) arranged beneath said holder and being connected with the pins of the integrated circuit package via a plug connection; two predetermined pins of said holder conductor pins being connected with two supply pins of the integrated circuit package;

(c) a pair of removable spare power sources arranged within said recess and connected in series between said two predetermined holder pins;

(d) said recess being defined by parallel major bottom and top sides between which said sources slide and an opening through which said sources pass into said recess;

(e) first and second conductive members having first ends embedded in said holder and connected with said two predetermined holder pins, respectively, said first conductive member having a second end located against said top side and in pressure contact with a first terminal of said first source, said second conductive member having a second and protruding in said recess and in the vicinity of said recess opening;

(f) a third conductive member secured to said cavity bottom side and having first and second ends receiving in pressure contact second opposite polarity terminals of said sources, respectively;

(g) a cover closing said recess opening by locking means and pushing said second source against said second end of said third conductive member; and (h) a flat conductive member secured beneath said cover and in pressure contact with a second terminal of said second source, said flat conductive member having a tab in pressure contact with said second protruding end of said second conductive member.

17. Apparatus as defined in claim 16, wherein said locking means comprises a bayonet fastening having a cover lug beneath which said flat conductive member tab is located.

18. Apparatus for holding an integrated circuit package (2) having conductive pins (20) connected therewith, comprising (a) a holder (1) for holding the integrated circuit package, said holder containing a recess (14);

(b) parallel rows of conductor pins (10) arranged adjacent said holder and being connected with the pins of the integrated circuit package via a plug connection; two predetermined pins of said holder conductor pins being connected with two supply pins of the integrated circuit package, said recess being arranged between said parallel rows of holder pins;

(c) a pair of removable spare power sources (4) arranged within said recess and connected in series with said two predetermined holder pins;

(d) said recess being defined between two sidewalls parallel to said holder pins and containing an opening located between said rows in front of said package;

(e) first conductive members having first ends embedded in said cavity sidewall aand connected with said predetermined holder pins, respectively, and having second ends projecting into said recess and against one of said side walls, said second ends of said first conductive members being connected in pressure contact with said first opposite polarity terminals of said sources, respectively; and (f) a third conductive member secured against the other sidewall and having two ends projecting into said recess and located against said other sidewall, said third conductive member ends being connected in pressure contact to second opposite polarity terminals of said sources, respectively.

19. Apparatus as defined in claim 18, and further comprising a cover closing said recess beneath said sources, said cover being lockable to said holder.

20. Apparatus as defined in claim 18, wherein said cover contains openings to receive said package pins, respectively.

21. Apparatus for holding an integrated circuit package (2) having conductive pins (20) connected therewith, comprising (a) a holder (1) for holding the integrated circuit package, said holder containig a recess (14);

(b) a plurality of conductor pins (10) arranged beneath said holder;

(c) a plurality of contact means (11) overlying said holder for connecting the package pins with said holder pins, two predetermined pins of said holder pins being connected with two supply pins of the integrated circuit package;

(d) a removable spare power source (4) arranged within said holder recess and including terminals connected between said two predetermined holder pins; and (e) a cover (9) removably connected with said holder between said holder and the package, said cover containing a plurality of openings for receiving said contact means, respectively.

22. The holder claimed in claim 21 wherein said contact means associated with each cover hole comprises two resilient conductive needs secured to the respective holder pin and slidably entering through an underlying end of said hole, the respective package pin entering through an overlying end of said hole and sliding between said two resilient conductive reeds.

23. A holder as claimed in claim 21 comprising means for locking said cover onto said holder.

24. The holder claimed in claim 23 wherein said locking means serves in pinching said package pins in said contact means after locking said cover onto said holder.

25. A holder as claimed in claim 21 comprising means for locking said cover onto said holder in response to a first pressure exerted onto said cover, and second means for pinching said package pins into said contact means in response to a second pressure exerted onto said package.

26. The holder claimed in claim 21 wherein said cover comprises two side-members carrying said holes and in pressure contact with said holder, a convex resilient cross-member having an upper side designed to be pushed by said package and ends secured to said side-members, means for locking said upper side of said cross-member to said holder, and means holding the locking of said cover onto said holder for decreasing the convexity of said resilient cross-member and moving said side-members in opposite directions in order to pinch said package pins in said contact means.

27. The holder claimed in claim 21 wherein said cover comprises a cross-member having a convex resilient upper side designed to be pushed by said package, two side-members secured to ends of said cross-member, carrying said holes and in pressure contact with said holder, a resilient lug secured beneath said resilient upper side of said cross-member and having a locking rib designed to cooperate with a locking aperture of said holder, said rib being locked into said locking aperture following a first pressure exerted onto cover in the direction of said holder, and the convexity of said upper side of said cross-member decreasing, said side-members being moved apart in opposite directions and said rib sliding under said holder following a second pressure exerted onto said package in the direction of said cover locked to said holder in order to fixedly connect said package pins to said holder pins in said contact means.

28. The holder claimed in claim 27 wherein said contact means associated with each cover hole comprises two resilient conductive reeds secured to the respective holder pin, said reeds slidably entering through an underlying end of said hole following said first pressure, and the respective package pins entering through an overlying end of said hole, sliding between said two resilient conductive reeds and being fixedly pinched between said reeds following said second pressure.

29. A holder as claimed in claim 21 comprising locking means to lock said cover onto said holder following a first pressure exerted onto said cover, to pinch said package pins in said contact means following a second pressure exerted onto said package, and to disengage said package pins from said contact means without unlocking said cover from said holder following a third pressure exerted onto said package.

30. The holder claimed in claim 29 wherein said contact means associated with each cover hole comprises two resilient conductive reeds secured to the respective holder pin, said reeds slidably entering through an underlying end of said cover hole in response to said first pressure, the respective package pin entering through an overlying end of said cover hole, sliding between said two resilient conductive reeds and being fixedly pinched between said reeds in response to said second pressure, and said two reeds moving away each to respect with the other, and said respective package pin sliding back up between said reeds in response to said third pressure.

31. The holder claimed in claim 29 wherein said cover comprises a cross-member having a convex resilient upper side designed to be pushed by said package, two side-members secured to ends of said cross-member, carrying said cover holes and in pressure contact with said holder, a resilient lug secured beneath said resilient upper side, said lug having a lower free tip perpendicularly slit to major surfaces of said holder and said package and having a flange located between said lug tip and said upper side of said cross-member, said holder carrying a hole having an end located beneath said convex upper side and including a ring having an inner groove, said holder hole having a chamber housing a washer freely moving between said ring and another end of said hole, said lug flange being inserted into said ring groove in response to said first pressure, said lug tip entering into said chamber, said lug flange being inserted beneath said ring, the convexity of said upper side of said cross-member decreasing and said side-members being moved apart in opposite directions, in response to said second pressure, said lug tip entering into said washer and said lug flange catching said washer in response to said third pressure, and then said lug tip moving back up said chamber, freeing said washer butting against said ring, and being stopped in said ring by an entrance of said lug flange into said ring groove, as a result of a resilience force exerted by said upper side of said cross-member and increasing the convexity of said upper side.

32. A holder as claimed in claim 21 comprising means for disconnecting said spare power source from said predetermined holder pins without removing said cover and package from said holder.

33. A holder as claimed in claim 21 comprising an insulating sheet underlying said holder through which said holder pins run.

34. A holder as claimed in claim 21 comprising a diode secured to said cover and interconnectable between one of said predetermined holder pins and a terminal of said spare power source.

35. A holder as claimed in claim 34 comprising an additional conductive pin subjacent to said holder and connected to said diode and connectable to said terminal of said spare power source.

36. The holder claimed in claim 34 wherein said cover comprises a conductive bent protruding member connected to said diode and connectable to said terminal of said spare power source.

37. Apparatus for holding an integrated circuit package (2) having conductive pins (20) connected therewith, comprising (a) a holder (1) for holding the integrated circuit package, said holder containing a recess (14);

(b) a plurality of conductor pins (10) arranged beneath said holder and being connected with the pins of the integrated circuit package via a plug connection; two predetermined pins of said holder conductor pins being connected with two supply pins of the integrated circuit package;

(c) a removable spare power source (4) arranged within said holder recess and including terminals connected between said two predetermined conductor pins;

(d) two conductive strips secured to two parallel edges of said holder, respectively; and (e) two connecting conductive members having first ends secured to said two predetermined holder pins and second ends secured to said two conductive strips, respectively.

38. Apparatus for holding an integrated circuit package (2) having conductive pins (20) connected therewith, comprising (a) a holder (1) for holding the integrated circuit package, said holder containing a recess (14);

(b) a plurality of conductive pins (10) arranged beneath said holder and being connected with the pins of the integrated circuit package via a plug connection;

(c) a removable spare power source (4) arranged within said holder recess and having first and second flat terminals;

(d) a first conductive member having a first end embedded in said holder and connected to a first predetermined pin of said holder and having a second end located in a bottom side of said recess for engaging in pressure contact said source first terminal;

(e) a second conductive member having a first end embedded in said holder and connected to a second predetermined pin of said holder and having a second end protruding into said recess;

(f) a cover closing said recess and pushing said source against said second end of said first conductive member;

(g) a flat conductive member secured beneath said cover in pressure contact with said source second terminal, said flat conductive member including a tab in pressure contact with said second protruding end of said second conductive member, said first and second predetermined holder pins being connected with two supply pins of the integrated circuit package; and (h) locking means for closing said cover, said locking means including a bayonet fastening having a cover lug beneath which said flat conductive member tab is located.

39. Apparatus for holding an integrated circuit package having conductive pins connected therewith, comprising (a) a holder for holding the integrated circuit package, said holder containing a recess;

(b) a plurality of conductor pins arranged beneath said holder and being connected with the pins of the integrated circuit package via a plug connection; , two predetermined pins of said holder conductor pins being connected with two supply pins of the integrated circuit package;

(c) a removable spare power source comprising a battery arranged within said holder recess connected between said two predetermined conductor pins, said battery including a circular terminal; and (d) means for disconnecting said battery from said predetermined holder pins without removing any member from said holder, said disconnecting means comprising (1) an electrically insulated cylindrical member including upstanding cylindrical segments receiving said battery terminal; and (2) a lever operable between a first position wherein a resilient conductive member connected with one of said predetermined pins engages said battery terminal and a second position wherein the resilient conductive member engages one of the upstanding cylindrical segments, thereby to connect and disconnect the battery, respectively.

40. The holder claimed in claim 39 wherein said spare power source comprises several juxtaposed series-connected power batteries, and said holder recess is divided into several sub-recesses for respectively receiving said batteries, said sub-recesses having dimensions analogous with those of said batteries, said insulating cylindrical member being rotatably mounted in one of said sub-recesses, and said lever being made up of a resilient material, being insertable in two holder grooves for said first and second emplacements and protruding said holder.

41. Apparatus for holding an integrated circuit package (2) having conductive pins (20) connected therewith, comprising
    (a) a holder (1) for holding the integrated circuit package, said holder containing a pair of recesses (14);
    (b) a plurality of conductor pins (10) arranged beneath said holder and being connected with the pins of the integrated circuit package via a plug connection; , two predetermined pins of said holder conductor pins being connected with two supply pins of the integrated circuit package;
    (c) a pair of removable spare power sources arranged within said recesses, respectively, and connected in series between said two predetermined holder pins;
    (d) a pair of first conductive members having first ends embedded in said holder and connected to said predetermined holder pins, respectively, and having second ends protruding into said two recesses, respectively for connection with first opposite polarity terminals of said sources, respectively;
    (e) a third conductive member secured to said holder between said two recesses, said third conductive member having ends located in the bottom portion of said recesses, respectively, for receiving in pressure contact second opposite polarity terminals of said sources;
    (f) a pair of covers closing said recesses and pressing said source against said third conductive member ends, respectively;
    (g) two flat conductive members secured beneath said covers in pressure contact with second opposite polarity terminals of said sources, said flat conductive members having tabs in pressure contact with said second protruding ends of said first conductive members, respectively; and
    (h) locking means for closing said covers, each of said locking means comprising a bayonet fastening having a cover lug beneath which one of said flat conductive member tabs is located.

* * * * *